(12) United States Patent
Hirano et al.

(10) Patent No.: US 6,549,465 B2
(45) Date of Patent: Apr. 15, 2003

(54) NONVOLATILE SEMICONDUCTOR MEMORY WELL VOLTAGE SETTING CIRCUIT WITHOUT LATCHUP AND SEMICONDUCTOR MEMORY DEVICE PROVIDED WITH THE CIRCUIT

(75) Inventors: Yasuaki Hirano, Tenri (JP); Shuichiro Kouchi, Tenri (JP); Yoshihisa Sekiguchi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/083,661

(22) Filed: Feb. 27, 2002

(65) Prior Publication Data

US 2002/0176284 A1 Nov. 28, 2002

(30) Foreign Application Priority Data

Feb. 28, 2001 (JP) ........................................ 2001-054391

(51) Int. Cl.[7] .............................................. G11C 16/00
(52) U.S. Cl. ............................ 365/185.23; 365/185.18; 365/185.27; 365/185.29; 365/185.33
(58) Field of Search ....................... 365/185.27, 185.18, 365/185.33, 185.23, 185.29

(56) References Cited

U.S. PATENT DOCUMENTS

| 5,790,460 | A | | 8/1998 | Chen et al. | ............. 365/184.29 |
| 6,052,305 | A | * | 4/2000 | Yang et al. | ............. 365/185.23 |
| 6,137,727 | A | * | 10/2000 | Cleveland | ............... 365/185.27 |
| 6,169,692 | B1 | * | 1/2001 | Ohkawa | ................. 365/185.27 |
| 6,434,047 | B1 | * | 8/2002 | Kurachi | ................. 365/185.18 |

FOREIGN PATENT DOCUMENTS

JP 11-39890 2/1999 ....................... 16/4

* cited by examiner

Primary Examiner—Tan T. Nguyen
(74) Attorney, Agent, or Firm—Morrison & Foerster LLP

(57) ABSTRACT

A well voltage setting circuit has a P-MOS transistor for applying erase pulse, a first N-MOS transistor for applying a reference voltage Vss to a P-well in a shutdown sequence after erase pulse application, and a second N-MOS transistor for forcing the P-well to the reference voltage Vss during write and read. The first N-MOS transistor has a driving capacity set to about 1/50 of that of the second N-MOS transistor, so that a time for forcing the P-well to the reference voltage Vss is long enough to prevent occurrence of local latch-up during erase.

13 Claims, 14 Drawing Sheets

NONVOLATILE SEMICONDUCTOR MEMORY WELL VOLTAGE SETTING CIRCUIT WITHOUT LATCHUP AND SEMICONDUCTOR MEMORY DEVICE PROVIDED WITH THE CIRCUIT

BACKGROUND OF THE INVENTION

The present invention relates to a well voltage setting circuit for erasing a nonvolatile semiconductor memory and, in particular, to a nonvolatile semiconductor memory well voltage setting circuit capable of preventing latch-up during erase of a nonvolatile semiconductor memory that uses a channel erase system and a semiconductor memory device provided with the circuit.

Conventionally, there has been an ETOX (registered trademark of Intel) type flash memory cell as a flash memory used most generally. FIG. 12 shows a schematic sectional view of this ETOX type flash memory cell. In this ETOX type flash memory cell, a floating gate 103 is formed on a substrate 108 located between a source 106 and a drain 107 via a tunnel oxide film 105, and a control gate 101 is further formed via a layer insulation film 102.

The principle of operation of this ETOX type flash memory cell will be described next. In this memory cell, according to voltage conditions shown in Table 1, during write, a voltage Vpp (10 V, for example) is applied to the control gate 101, a reference voltage Vss (0 V, for example) is applied to the source 106, and a voltage of 6 V is applied to the drain 107.

TABLE 1

Application Voltages in Conventional Modes

|  | Control Gate | Drain | Source | Substrate |
| --- | --- | --- | --- | --- |
| Write | 10 V | 6 V/0 V | 0 V | 0 V |
| Erase | −9 V | Open | 4 V | 0 V |
| Read | 5 V | 1 V | 0 V | 0 V |

With this arrangement, a large amount of current flows through the channel region to generate hot electrons in a portion on the drain side where the electric field is high. The electrons are injected into the floating gate 103 to raise a threshold voltage of this memory cell. The distribution state of the raised threshold voltage is shown in FIG. 13. In FIG. 13, the vertical axis represents the number N of memory cells, and the horizontal axis represents the threshold voltage of the memory cells.

In erase operation, a voltage Vnn (−9 V, for example) is applied to the control gate 101, and a voltage Vpe (4 V, for example) is applied to the source 106, so as to extract electrons from the floating gate 103 on the source side. Consequently, the threshold voltage of the memory cell is lowered. FIG. 13 also shows the distribution state of the lowered threshold voltage. In this erase operation, a BTBT (Band To Band Tunneling) current flows. Concurrently, hot holes and hot electrons are generated. The hot electrons flow toward the substrate 108. On the other hand, the hot holes are pulled toward the tunnel oxide film 105 to be trapped in the tunnel oxide film 105. This trapping phenomenon degrades reliability.

In read operation of the memory cell, a voltage of 1 V is applied to the drain 107, and a voltage of 5 V is applied to the control gate 101. In this case, when this memory cell is in the erased state, that is, when the threshold voltage is low, a current flows through the cell. By this, the storage information is determined to be "1". When this memory cell is in the programmed state, that is, when the threshold voltage is high, no current flows through the memory cell. By this, the storage information is determined to be "0".

In the ETOX type flash memory cell, as described above, there is a problem that the BTBT current generated on the source side in the erase operation deteriorates the reliability of the memory cell.

As a means for solving this problem, there is a method for using channel erase that causes no BTBT current during the erase operation. This method is disclosed in Japanese Patent Laid-Open Publication No. HEI 11-39890. The write and read operations of this method are similar to those of the aforementioned source side erase system.

FIG. 14 shows the operational principle of this channel erase system. As shown in FIG. 14, in erase operation, a voltage Vnn (−9 V, for example) is applied to a word line connected to a control gate 191 on a layer insulation film 192, and a voltage Vesc (+6 V, for example) is applied to a source 195 and a well 197. The source 195 may be in an OPEN state. By this operation, an intense electric field is applied to a tunnel oxide film 194 located between the channel layer and the floating gate 193, so that electrons are extracted from the floating gate 193 by the FN (Fowler-Nordheim) tunneling phenomenon and the threshold value are lowered. The following Table 2 shows the voltage application conditions in this case.

TABLE 2

Application Voltages in Conventional Modes

|  | Control Gate | Drain | Source | Substrate |
| --- | --- | --- | --- | --- |
| Write | 10 V | 6 V/0 V | 0 V | 0 V |
| Erase | −9 V | Open | 6 V or Open | 6 V |
| Read | 5 V | 1 V | 0 V | 0 V |

At this time, a potential (Vp-well) of the well 197 is equal to that of the source 195, and therefore, no electric field is concentrated on a boundary portion between the source 195 and the well 197, so that no BTBT current is generated. Consequently, no hot hole is generated. Therefore, trap of hot holes does not occur in the tunnel oxide film 194, so that the reliability of the memory cell is improved.

Next, FIG. 15 shows in more detail a structural cross-sectional view of the memory cell in which the channel erase system shown in FIG. 14 is put into practice. This structure is called the triple well structure, wherein an N-well 209 is provided so as to electrically separate a substrate 208 from a P-well 204 in which the memory cell is formed.

In this case, a reference voltage (0 V, for example) is applied to the P-substrate 208 so as to put a bit line BL connected to the drain 207 into a floating state. A voltage Vesc (6 V, for example) is further applied to a line CA connected to a contact region 205 connected to the source 206 so as to apply the voltage Vesc to the P-well 204. The common source line CS is a line for commonly connecting together the sources in a block.

Further, a voltage Vnn (−9 V, for example) is applied to a control gate 201 via the word line WL connected to the control gate 201, and a voltage Vnw (not lower than 6 V, for example) is applied to the N-well 209.

By this operation, the source 206 and the P-well 204 are made to have same potential, effecting channel erase.

In FIG. 15, the region denoted by the symbol N is an N+ diffusion region and represents a contact region for electrical connection to the N-well 209. Moreover, in FIG. 15, the region denoted by the symbol P is a P$^+$ diffusion region and represents a contact region for electrical connection to the P-well 204.

During erase (also, write and during operations), as drive circuits (drivers) for applying the aforementioned various voltages, there are provided a word line drive circuit for driving the word line WL, a bit line drive circuit for driving the bit line BL, a common source line drive circuit for driving the common source line, an N-well drive circuit and a P-well drive circuit, which are arranged in the peripheral portion of the memory cell array.

Further, in order to supply various voltages to these drive circuits, there are arranged a positive voltage charge pump circuit for generating a positive high voltage from a power voltage through boosting, a negative voltage charge pump circuit for generating oppositely a negative high voltage from the power voltage through boosting, regulator circuits for generating various voltages by deboosting inputs outputted from these charge pump circuits, stabilizing those voltages and outputting the voltages, and so on.

FIG. 16 shows a construction necessary for, in particular, erase among the peripheral circuits of the memory cell array. FIG. 17 shows one block of 64 KB of the memory cell array. These memory cells are formed in one P-well (see FIG. 18).

As shown in FIG. 17, the memory cell array of one block is constructed by a plurality of memory cells MS arranged on the array. The control gates of 512 memory cells MS are connected to this word line WL0, as in the cases with the word lines WL1 through WL1023.

The drains of 1024 memory cells MS are connected to the bit line BL0, as in the cases with the bit lines BL1 through BL511.

The sources of the memory cells MS in an identical block are connected to a common source line SL.

Further, the well portions of the memory cells MS in an identical block are formed in a common P-well, and a voltage is applied from a terminal PW to this common P-well. As shown in FIG. 16, 1024 word line drivers (word line drive circuits) 152 for driving the aforementioned respective word lines WL0 through WL1023 are arranged in the peripheral portion of this memory cell array 153.

When an erase pulse is applied, a voltage Vnn (−9 V, for example) outputted from the negative voltage charge pump circuit 151 for generating a negative high voltage from the power voltage through boosting is inputted as a low-potential side voltage to the word line driver 152.

On the other hand, a reference voltage Vss is inputted to a high-potential side voltage line VPX of the word line driver 152. This high-potential side voltage line VPX comes to have a voltage of 10 V during write and comes to have a voltage of 5 V during read, and fixed to the reference voltage Vss when the erase pulse is applied because the operation of the regulator circuit 158 is stopped.

The word line driver 152 is operated by a decoder signal from a decoder circuit (not shown). During write and read, this decoder circuit generates a control signal for applying the control gate voltage shown in the aforementioned Table 2 to the word line sequentially selected during write and read, and during erase, for applying a specified voltage to the word lines selected in blocks or of all the blocks. Moreover, the word line driver 152 is controlled so as to output the reference voltage Vss to the non-selected word lines.

Moreover, an output (8 V, for example, when the erase pulse is applied) from the high-voltage charge pump circuit 160, which generates a positive high voltage from the power voltage through boosting, is stabilized in a regulator circuit 157. The stabilized voltage (6 V, for example, when the erase pulse is applied) obtained by the regulator circuit 157 is supplied to a P-well driver 156 and an N-well driver 155. The P-well driver 156 outputs this voltage to a terminal PW (see FIG. 15), and the N-well driver 155 outputs this voltage to a terminal NW (see FIG. 15).

The block diagram of FIG. 16 does not show the bit line drive circuit for driving the bit line BL and the common source line drive circuit for driving the common source line.

The operation of the drive circuit located on the well side of this channel erase system during erase will be described next. When the erase starts, the negative voltage charge pump 151 operates to output a negative voltage Vnn (−9 V, for example) to the word line WL. Moreover, the positive voltage charge pump 160 operates to output a positive voltage (8 V, for example). This charge pump output voltage is formed into a stabilized output of 6 V by the regulator circuit 157 and inputted to the N-well driver 155. The output of the N-well driver 155 comes to have a voltage of 6 V, and a voltage of 6 V is outputted from the terminal NW to an N-well 179 of the memory cell array shown in FIG. 18.

The N-well drive circuit (driver) 155 is constructed by a well-known technology, and no detailed description is herein provided therefor.

Likewise, with regard to the potential of the P-well, the output (8 V, for example) from the positive voltage charge pump circuit 160 is inputted to the regulator circuit 157. The regulator circuit 157 outputs the stabilized output of 6 V which is inputted to the terminal PW. Then, the voltage of 6 V is inputted to a contact region 175 (i.e., P diffusion region) shown in FIG. 18, so that the P-well 174 have a potential of 6 V.

Next, FIG. 19 shows one example of the P-well drive circuit (driver) 156. FIG. 20 shows an example of the construction of the high-voltage level shifter circuit 163 in FIG. 19. In this P-well driver 156, when a voltage of 6 V is applied to a voltage line hhers and an N-MOS transistor 162 is put into an OFF state when a signal erswel comes to have high level (power voltage level or, for example, 5 V). On the other hand, in a high-voltage level shifter circuit 163, a P-MOS transistor 213 and an N-MOS transistor 212 are turned on, and a P-MOS transistor 211 and an N-MOS transistor 214 are turned off. By this operation, L (Low) level (reference voltage Vss, for example) is outputted as an output 216 from the high-voltage level shifter circuit 163, and the P-MOS transistor 161 of FIG. 19 is turned on, making the terminal PW have the potential level (6 V) of the voltage line hhers.

On the other hand, if L level (reference voltage Vss, for example) is inputted as the signal erswel, then the terminal PW comes to have L level (reference voltage Vss, for example).

Next, there will be described a shutdown sequence in which the erase pulse application ends and both the well and word line voltages come to have the reference voltage. If this shutdown sequence is executed, then the signal erswel comes to have L level to turn off the P-MOS transistor 161 and turn on the N-MOS transistor 162. By this operation, the P-well 174 of FIG. 18 is forced to the reference voltage Vss. Further, the word line WL side is also forced to this reference voltage Vss, and finally, the positive voltage charge pump 160 and the negative voltage charge pump 151 are stopped.

FIG. 21 shows one example of the waveforms of the word line voltage and the P-well voltage in the shutdown sequence after the erase pulse application. In FIG. 21, the origin is at the time of the end of the erase pulse application.

As shown in FIG. 21, in accordance with the timing when the P-well 174 of FIG. 18 is forced to the reference voltage Vss, the word line voltage is changed from −9 V to about −10 V by further lowering by about 1 V. Subsequently, this word line voltage is slowly forced to 0 V. The reason why the above phenomenon occurs will be described in the order of the matters (1), (2) and (3) as follows:

(1) The reason why the operation of forcing the P-well voltage to the reference voltage Vss is steep,
(2) The reason why the word line voltage is once lowered from −9 V to about −10 V,
(3) The reason why the operation of forcing the word line voltage to the reference voltage Vss is dull (broad).

The matter (1) is related to the operation during write. The construction of the memory cell when the channel erase system is used will be described first. As shown in FIG. 18, with regard to the sectional structure of the portion in which the memory cells form an array, each memory cell is formed inside the P-well 174 electrically separated from a P-substrate 178 by the N-well 179. In FIG. 18 are shown a control gate 171, a floating gate 172, contact regions 173 and 175, a source 176 and a drain 177, and the word line WL is connected to the control gate 171.

The triple well structure is the structure required for applying a positive voltage (6 V, for example) to the P-well 174 during erase. Therefore, the memory cell that exists in the P-well 174 is a memory cell of one block (64 KB, for example) erased through batch erase. In this case, a terminal for supplying a voltage to the P-well 174 is arranged only in the peripheral portion inside the memory cell array. In the normal case, the P-well 174 is electrically connected to the substrate 178.

During write, a large amount of current (for example, 500 μA per cell) flows through the channel to execute program as described above. At this time, a current (for example, 100 μA per cell) also flows on the substrate 178 side at the same time. Therefore, when this program is concurrently executed with, for example, eight bits, the current that flows on the substrate 178 side amounts to about 800 μA. This current is to be forced to the reference voltage Vss via the N-MOS transistor 162 of the P-well driver shown in FIG. 19.

In this case, it is required to reliably force the potential of the P-well 174 to the reference voltage Vss. Therefore, a comparatively large size is needed as the transistor size in order to secure a great current drawing capacity. For example, the channel width is minimized on the design rule, and the channel width W is widened so that W=100 μm. As a result, in the shutdown sequence during erase, the voltage of the P-well 174 is discharged through this N-MOS transistor 162. This is the reason why the P-well voltage comes to have a steep waveform as shown in FIG. 21.

The reason why the word line voltage is once lowered as shown in FIG. 21 according to the aforementioned matter (2) will be described next. When the P-well 174 is sharply forced from 6 V to the reference voltage Vss by the capacitive coupling of the word line WL with the P-well 174, the word line voltage changes from, for example, −9 V to a further negative voltage of −10 V. FIG. 22 shows an equivalent circuit diagram of this capacitive coupling. For example, in one block (64 KB) of a flash memory cell array that has a minimum processing level of, for example, 0.25 μm, a capacitance Cww becomes:

$$0.7\,fF \times 64 \times 8 \times 1024 = 367\,pF$$

which is very large. Therefore, the coupling ratio also becomes great. Consequently, as shown in FIG. 21, the word line voltage is lowered from −9 V to −10 V in the shutdown sequence.

The reason why the forcing of the word line voltage to the reference voltage Vss is broad according to the aforementioned matter (3) will be described next. Normally, the word line drive circuit (driver) for driving the word line WL is to drive one word line. Therefore, as shown in FIG. 23, output-stage transistors 221 and 222 of the word line driver have a load smaller than that of the P-well driver that is required to fix the well potential, or a large capacitive load. Therefore, the driving capacity of the word line driver is not required to be as large as that of the P-well driver.

Furthermore, since each of the word line drivers is connected to one word line, it is required to arrange a large number of the word line drivers. This becomes a factor for increasing the layout area, and therefore, the output stage transistor of the word line driver is restrained to a comparatively small size.

Consequently, as shown in FIG. 21, the word line voltage after the erase pulse application is slowly i.e. broadly forced from −9 V to the reference voltage Vss.

It is to be noted that the small driving capacity of the output-stage transistor 222 of the word line driver shown in FIG. 23 is attributed to the capacitive coupling as shown in FIG. 21 and also leads to the susceptibility of the word line to voltage fluctuations with respect to the swift movement of the P-well voltage.

The point that the aforementioned matter (2) occurring in the prior art example poses a problem will be described below.

As shown in FIG. 23 described hereinabove, the word line driver 152 has a non-inversion type high-voltage level shifter circuit 223, and the gates of the P-MOS transistor 221 and the N-MOS transistor 222 are connected to the output of the circuit. The source and the N-well (not shown) of this P-MOS transistor 221 are connected to a voltage line VPX. This voltage line VPX, which comes to have a voltage of 10 V during write and have a voltage of 5 V during read, comes to have the reference voltage Vss during erase as a consequence of the stop of the regulator circuit 158 shown in FIG. 16.

On the other hand, the source and the P-well of the N-MOS transistor 222 are connected to a voltage line Vnn. This voltage line Vnn, which comes to have a voltage of −9 V during erase, has the reference voltage Vss during write and read as a consequence of the stop of the regulator circuit 157 shown in FIG. 16. Then, the drains of these transistors 221 and 222 are connected together to the word line WL.

It is to be noted that the non-inversion type high-voltage level shifter circuit 223 converts the level of a decoding signal $D_{WL}$ from a decoding circuit (not shown) into a voltage signal level across the reference voltage and Vnn in a non-inversion manner during erase. This decoding signal $D_{WL}$ is a signal of a voltage level across the power voltage and the reference voltage.

A problem that occurs in the N-MOS transistor 222 of this word line driver 152 will be described next with reference to FIG. 24. The source 184 and the P-well 186 of this N-MOS transistor 222 have a voltage Vnn (−9 V), while the gate 181 receives the output (reference voltage Vss in this case) from the non-inversion type high-voltage level shifter circuit 223 and is put in the ON state. To the word line WL connected to the drain 185 of this N-MOS transistor 222 is outputted a voltage of −9 V.

In FIG. 24, the symbol P denotes a $P^+$ diffusion region, which is a contact region 183 for supplying a voltage to the P-well 186. Further, the symbol N denotes an $N^+$ diffusion region, which forms the regions of a source 184 or a drain 185. Moreover, the symbol N in the N-well 187 is an $N^+$ diffusion region, which is a contact region for supplying a voltage to the N-well 187.

When the erase pulse application ends and the system operation enters the shutdown sequence, there is a case where the word line voltage temporarily drops from −9 V to, for example, −10 V as shown in FIG. 21.

As described above, if there occurs a state in which the potential (−9 V) of the P-well 186 goes beyond a built-in voltage (0.6 V) with respect to the potential (−10 V) of the drain 185 connected to the word line WL, then a forward bias occurs in the PN junction portion, and a current flows from the P-well 186 to the drain 185.

If, for example, the P-well 186 has a voltage of −9 V and the drain 185 comes to have a voltage of not higher than −9.6 V, then the forward bias occurs between the drain 185 and the P-well 186, and a current flows. If a current flows due to the forward bias, then this operates as a trigger to cause local latch-up. If this latch-up occurs, then a malfunction occurs, and this may leads to the destruction of the flash memory in the worst case.

SUMMARY OF THE INVENTION

Accordingly, an object of the present invention is to provide a well voltage setting circuit of a nonvolatile semiconductor memory capable of preventing the aforementioned latch-up in the shutdown sequence after erase pulse application when channel erase is executed in a flash memory and a semiconductor memory device provided with the well voltage setting circuit.

In order to achieve the aforementioned objective, the present invention provides a well voltage setting circuit of a nonvolatile semiconductor memory, comprising:

floating-gate field-effect transistors able to electrically write and erase information, the floating-gate field-effect transistors being each provided with a control gate, a floating gate, a drain and a source, and arranged in rows and columns into a block to form a memory cell array;

a plurality of row lines each connected to control gates of the floating-gate field-effect transistors in each row;

a plurality of column lines each connected to drains of the floating-gate field-effect transistors in each column;

a source line connected commonly to sources of the floating-gate field-effect transistors in the block;

a first voltage supply circuit for applying a first voltage to a well which constitutes each of channel regions in arrangement of the memory cell array to be erased when an erase pulse is applied to the memory cell array in an erase operation wherein information of the memory cell array is erased on a block basis by channel erase using a Fowler-Nordheim tunneling phenomenon;

a second voltage supply circuit for applying a reference voltage to the well when the erase pulse application ends; and a third voltage supply circuit for applying the reference voltage to the well during write and during read.

According to the well voltage setting circuit of this invention, the first voltage supply circuit supplies the first voltage to the well when the erase pulse is applied, and the second voltage supply circuit applies the reference voltage to the well when this erase pulse application ends. Moreover, during write and during read, the third voltage supply circuit applies the reference voltage to the well.

As described above, according to this invention, the reference voltage is supplied to the well by the second voltage supply circuit when the erase pulse application ends, and the third voltage supply circuit applies the reference voltage to the well during write and during read.

Therefore, the capacity of this second voltage supply circuit is set to the capacity appropriate for supplying the reference voltage to the well when the erase pulse application ends, while the capacity of the third voltage supply circuit can be set to the capacity appropriate for supplying the reference voltage to the well during write and during read. With the above capacity setting of the second and third voltage supply circuits, it is enabled to prevent the reduction in the word line voltage attributed to the capacitive coupling of the well with the word line and prevent the latch-up attributed to the forward bias during erase in the word line driver.

In one embodiment of the present invention, the first voltage supply circuit is constructed of a P-MOS transistor, and the second and third voltage supply circuits are each constructed of an N-MOS transistor.

According to this embodiment, since the first voltage supply circuit is constructed of a P-MOS transistor, and the second and third voltage supply circuits are each constructed of an N-MOS transistor, there are easily constructed the first voltage supply circuit that applies the first voltage to the well when the erase pulse is applied, the second voltage supply circuit that applies the reference voltage to the well after the erase pulse application and the third voltage supply circuit that applies the reference voltage to the well during write and read.

In one embodiment of the present invention, the second voltage supply circuit has a current supply capacity smaller than that of the third voltage supply circuit.

According to this embodiment, the second voltage supply circuit more slowly forces the well to the reference voltage than the third voltage supply circuit after the first voltage supply circuit applies the first voltage to the well. With this arrangement, it is enabled to prevent the reduction in the word line voltage attributed to the capacitive coupling of the well with the word line and to prevent the latch-up attributed to the forward bias during erase in the word line driver.

In one embodiment of the present invention, the nonvolatile semiconductor memory well voltage setting circuit further comprises a gate control circuit for controlling a gate of the N-MOS transistor of the second voltage supply circuit, wherein the gate control circuit is set so that the gate of the N-MOS transistor of the second voltage supply circuit needs a time of not shorter than 100 nanoseconds at a rise of the voltage thereof.

According to this embodiment, in the above gate control circuit, the gate of the N-MOS transistor of the second voltage supply circuit is set so as to require a time of not shorter than 100 nanoseconds at the rise of the voltage. Therefore, the N-MOS transistor of the second voltage supply circuit slowly leads the well to the reference potential, prevents the reduction in the word line voltage attributed to the capacitive coupling of the well with the word line and prevents the latch-up attributed to the forward bias during erase in the word line driver.

The present invention also provides a well voltage setting circuit of a nonvolatile semiconductor memory, comprising:

floating-gate field-effect transistors able to electrically write and erase information, the floating-gate field-effect transistors being each provided with a control gate, a floating gate, a drain and a source, and arranged in rows and columns into a block to form a memory cell array;

a plurality of row lines each connected to control gates of the floating-gate field-effect transistors in each row;

a plurality of column lines each connected to drains of the floating-gate field-effect transistors in each column;

a source line connected commonly to sources of the floating-gate field-effect transistors in the block;

a first voltage supply circuit for applying a first voltage to a well which constitutes each of channel regions in arrangement of the memory cell array to be erased when an erase pulse is applied to the memory cell array in an erase operation wherein information of the memory cell array is erased on a block basis by channel erase using a Fowler-Nordheim tunneling phenomenon, wherein the first voltage supply circuit is constituted of a P-MOS transistor;

a second voltage supply circuit for applying a reference voltage to the well when the erase pulse application ends and during write and during read, wherein the second voltage supply circuit is constituted of an N-MOS transistor; and a control circuit for controlling the second voltage supply circuit, the control circuit being constituted of a level shifter to apply a voltage lower than a power voltage to a gate of the N-MOS transistor in turning on the N-MOS transistor of the second voltage supply circuit when the erase pulse application ends and to apply a voltage higher than the power voltage to the gate of the N-MOS transistor in turning on the N-MOS transistor of the second voltage supply circuit during write and during read.

In this invention, the control circuit that controls the second voltage supply circuit is constructed of the level shifter to apply a voltage lower than the power voltage to the gate of the N-MOS transistor when the N-MOS transistor of this second voltage supply circuit is turned on at the end of the erase pulse application and apply a voltage higher than the power voltage to the gate of the N-MOS transistor when the N-MOS transistor of this second voltage supply circuit is turned on during write and during read.

Therefore, the N-MOS transistor of the second voltage supply circuit comes to have a small capacity in the shutdown sequence after the erase pulse application as compared with the capacity thereof during write and during read, and the well can be slowly brought closer to the reference voltage. Therefore, it is enabled to prevent the reduction in the word line voltage attributed to the capacitive coupling of the well with the word line and prevent the latch-up attributed to the forward bias during erase in the word line driver.

The present invention further provides a well voltage setting circuit of a nonvolatile semiconductor memory, comprising:

floating-gate field-effect transistors able to electrically write and erase information, the floating-gate field-effect transistors being each provided with a control gate, a floating gate, a drain and a source, and arranged in rows and columns into a block to form a memory cell array;

a plurality of row lines each connected to control gates of the floating-gate field-effect transistors in each row;

a plurality of column lines each connected to drains of the floating-gate field-effect transistors in each column;

a source line connected commonly to sources of the floating-gate field-effect transistors in the block;

a first voltage supply circuit for applying a first voltage to a well which constitutes each of channel regions in arrangement of the memory cell array to be erased when an erase pulse is applied to the memory cell array in an erase operation wherein information of the memory cell array is erased on a block basis by channel erase using a Fowler-Nordheim tunneling phenomenon;

a second voltage supply circuit for applying a reference voltage to the well after the erase pulse application and during write and during read; and a fourth voltage supply circuit whose capacity for supplying the reference voltage to an input power line of the second voltage supply circuit is made smaller than the capacity thereof during write and during read in a shutdown sequence after the erase pulse application.

In this invention, the fourth voltage supply circuit comes to have a smaller capacity to supply the reference voltage to the input power line of the second voltage supply circuit than the capacity thereof during write and during read in the shutdown sequence after the erase pulse application. Therefore, the second voltage supply circuit comes to have a smaller capacity than the capacity thereof during write and during read in the shutdown sequence after the erase pulse application, and the well can be slowly brought closer to the reference voltage. Therefore, it is enabled to prevent the reduction in the word line voltage attributed to the capacitive coupling of the well with the word line and prevent the latch-up attributed to the forward bias during erase in the word line driver.

In one embodiment of the present invention, the fourth voltage supply circuit is constituted of a resistor equivalent element and a first N-MOS transistor to supply a voltage for applying the reference voltage to the well through only the resistor equivalent element to the input power line of the second voltage supply circuit after the erase pulse application by the first voltage supply circuit, and to supply a voltage for applying the reference voltage to the well to the input power line of the second voltage supply circuit through the first N-MOS transistor and the resistor equivalent element by turning on the first N-MOS transistor during read and during write.

In this embodiment, the fourth voltage supply circuit is constructed of the resistor equivalent element and the first N-MOS transistor and supplies the voltage for applying the reference voltage to the well to the input power line of the second voltage supply circuit only through the resistor equivalent element after the erase pulse application by the first voltage supply circuit. Therefore, the second voltage supply circuit comes to have a smaller capacity than the capacity thereof during write and during read in the shutdown sequence after the erase pulse application, and the well can be slowly brought closer to the reference voltage. Therefore, it is enabled to prevent the reduction in the word line voltage attributed to the capacitive coupling of the well with the word line and prevent the latch-up attributed to the forward bias during erase in the word line driver.

In one embodiment of the present invention, the fourth voltage supply circuit is constituted of a first N-MOS transistor and a second N-MOS transistor to supply a voltage for applying the reference voltage to the well through the second N-MOS transistor whose gate voltage is the power voltage to the input power line of the second voltage supply circuit after the erase pulse application by the first voltage supply circuit, and to supply a voltage for applying the reference voltage to the well to the input power line of the second voltage supply circuit by concurrently turning on the first N-MOS transistor during read and during write.

In this embodiment, the fourth voltage supply circuit is constructed of the first N-MOS transistor and the second N-MOS transistor and supplies the voltage for applying the reference voltage to the well to the input power line of the second voltage supply circuit through the second N-MOS transistor whose gate voltage is the power voltage after the erase pulse application by the first voltage supply circuit. Moreover, the fourth voltage supply circuit turns on the first N-MOS transistor together with the second N-MOS transistor during read and during write to supply the voltage for applying the reference voltage to the well to the input power line of the second voltage supply circuit.

Therefore, according to this embodiment, the second voltage supply circuit comes to have a smaller capacity than the capacity thereof during write and during read in the shutdown sequence after the erase pulse application, and the well can be slowly brought closer to the reference voltage. Therefore, it is enabled to prevent the reduction in the word line voltage attributed to the capacitive coupling of the well with the word line and prevent the latch-up attributed to the forward bias during erase in the word line driver.

The present invention still further provides a well voltage setting circuit of a nonvolatile semiconductor memory, comprising:

floating-gate field-effect transistors able to electrically write and erase information, the floating-gate field-effect transistors being each provided with a control gate, a floating gate, a drain and a source, and arranged in rows and columns into a block to form a memory cell array;

a plurality of row lines each connected to control gates of the floating-gate field-effect transistors in each row;

a plurality of column lines each connected to drains of the floating-gate field-effect transistors in each column;

a source line connected commonly to sources of the floating-gate field-effect transistors in the block;

a first voltage supply circuit for applying a first voltage to a well which constitutes each of channel regions in arrangement of the memory cell array to be erased when an erase pulse is applied to the memory cell array in an erase operation wherein information of the memory cell array is erased on a block basis by channel erase using a Fowler-Nordheim tunneling phenomenon;

a second voltage supply circuit for applying a reference voltage to the well after the erase pulse application and during write and during read;

an intermediate voltage supply circuit for supplying an intermediate voltage for making the potential of the well once have an intermediate level between a potential when the erase pulse is applied and the reference voltage to an input power line of the second voltage supply circuit after the erase pulse application by the first voltage supply circuit; and a reference voltage supply circuit for making the potential of the well have the intermediate level by the intermediate voltage supply circuit and thereafter applying the reference voltage to the input power line of the second voltage supply circuit in a shutdown sequence after the erase pulse application.

In this invention, the intermediate voltage supply circuit supplies the intermediate voltage to the input power line of the second voltage supply circuit after the erase pulse application by the first voltage supply circuit, making the well voltage once have the level between the potential when the erase pulse is applied and the reference voltage and thereafter applying the reference voltage to the well from the second voltage supply circuit by the reference voltage supply circuit.

Therefore, the well can be more slowly brought closer to the reference voltage in the shutdown sequence after the erase pulse application than in the write and read stages. Therefore, it is enabled to prevent the reduction in the word line voltage attributed to the capacitive coupling of the well with the word line and prevent the latch-up attributed to the forward bias during erase in the word line driver.

In one embodiment of the present invention, the nonvolatile semiconductor memory device comprises therein the well voltage setting circuit stated above.

In this embodiment, there can be provided a nonvolatile semiconductor memory device capable of preventing the reduction in the word line voltage attributed to the capacitive coupling of the well with the word line and preventing the latch-up attributed to the forward bias during erase in the word line driver by virtue of the built-in well voltage setting circuit.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

This invention will be described in detail below on the basis of embodiments with reference to the attached drawings.

Figure 1:
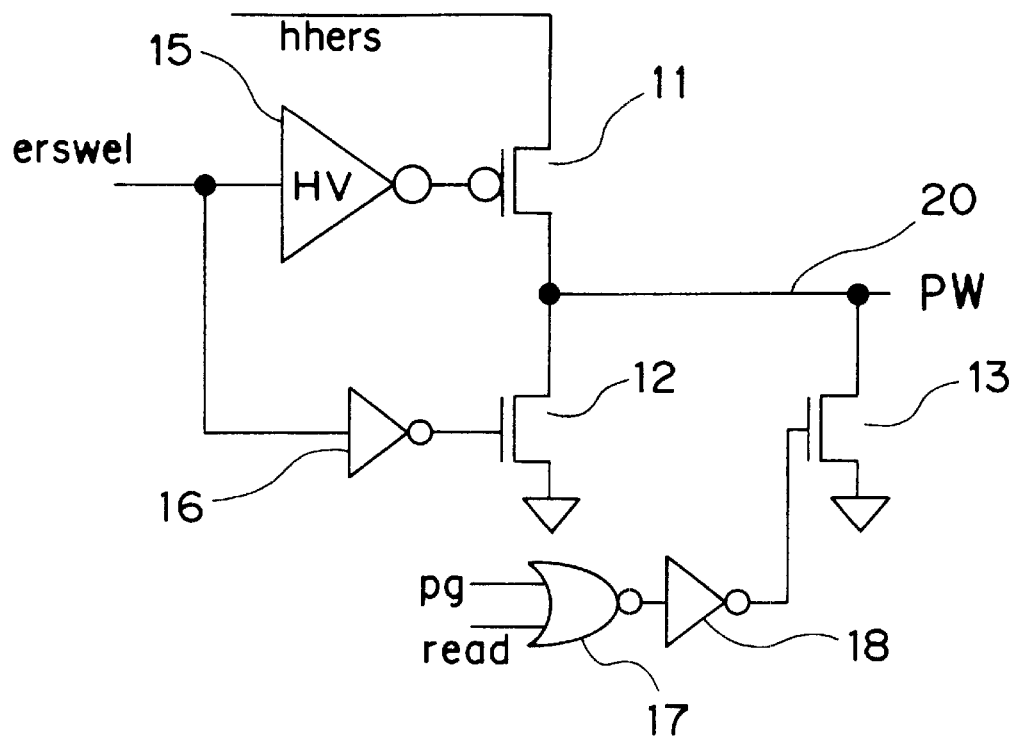
FIG. 1 is a circuit diagram of a P-well driver according to a first embodiment of this invention.

FIG. 1 shows a construction of a P-well driver circuit as a first embodiment of a well voltage setting circuit of a nonvolatile memory according to this invention.

Figure 16:
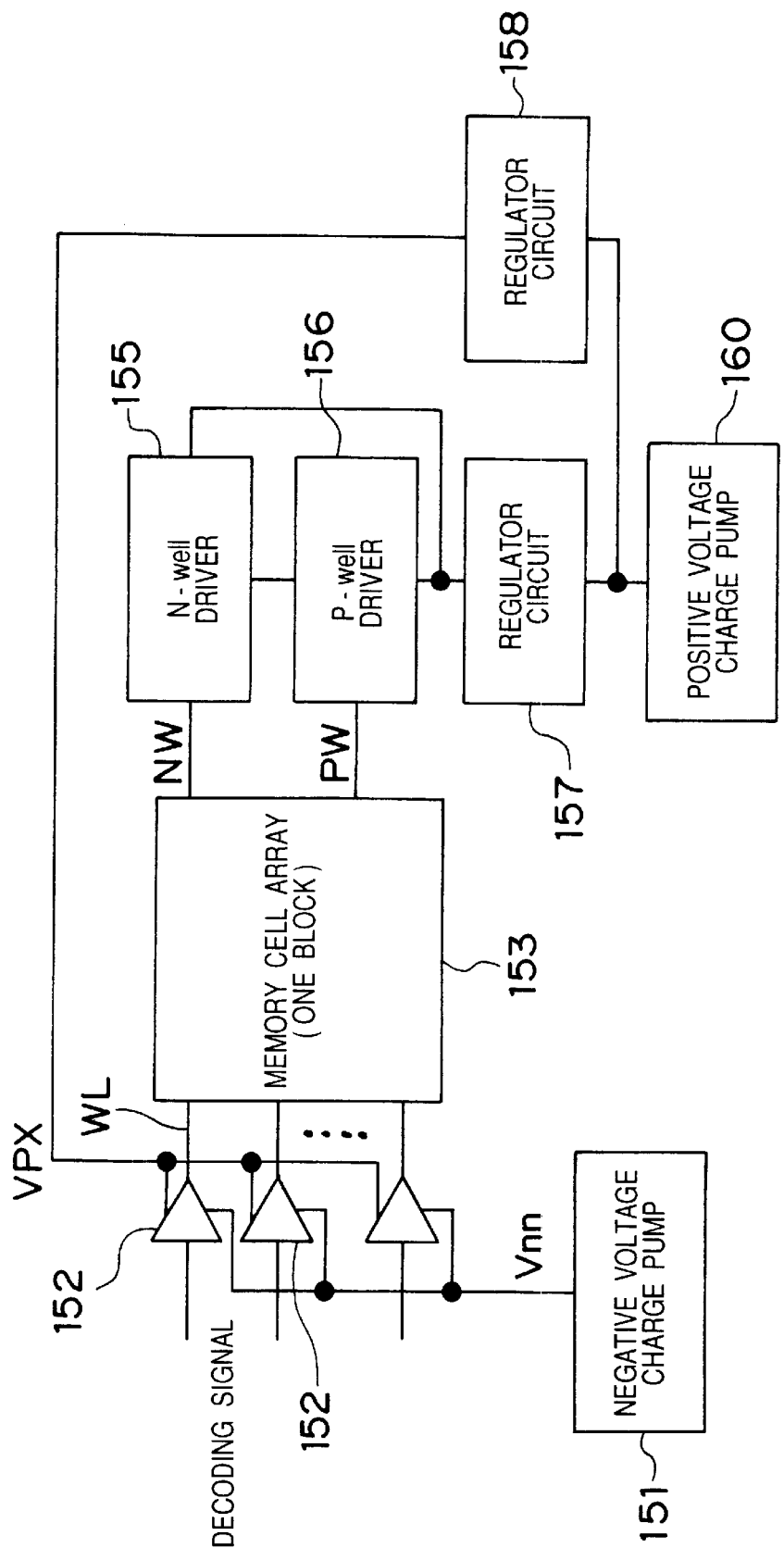
FIG. 16 is a block diagram of an erase circuit.
Figure 17:
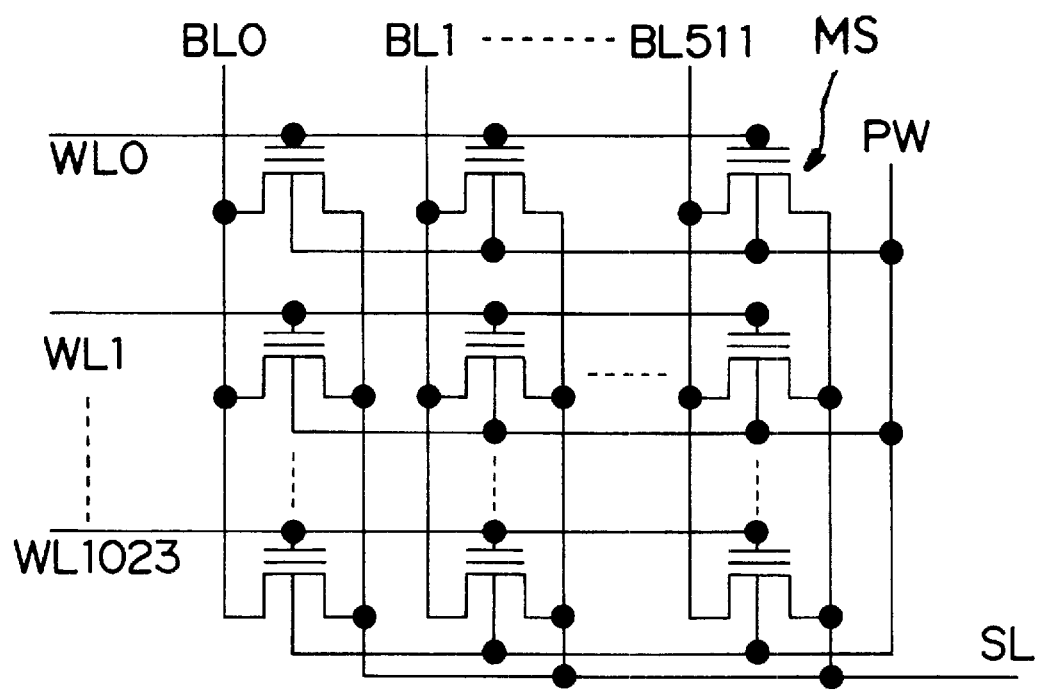
FIG. 17 is a diagram showing one example of a flash memory array structure.
Figure 18:
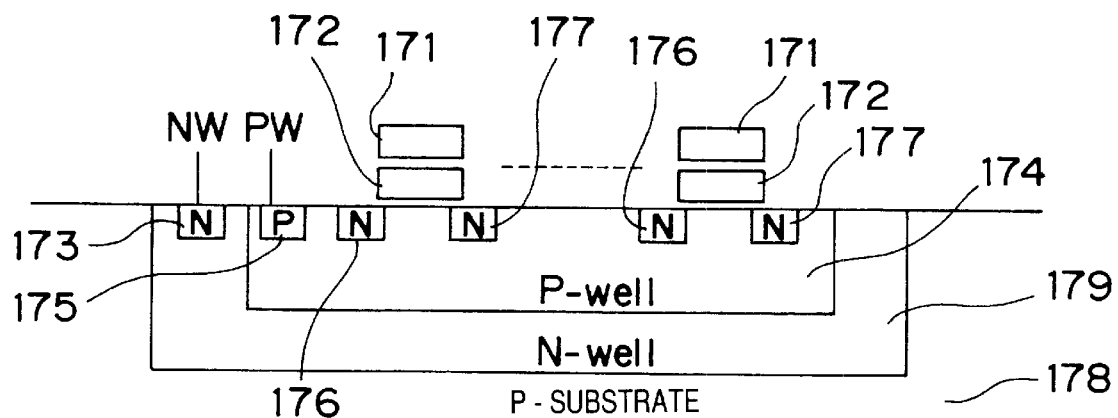
FIG. 18 is a cross-sectional structural diagram of a memory array.

The P-well driver circuit of the first embodiment is used in place of the P-well driver circuit 156 in the peripheral circuit of the memory cell array 153 shown in FIG. 16.

The P-well driver circuit of the first embodiment has a high-voltage level shifter 15, a P-MOS transistor 11 whose gate is connected to the output side of this high-voltage level shifter 15, and an N-MOS transistor 12 whose gate is connected to the input side of the high-voltage level shifter 15 via an inverter 16. A connection line between a drain of this P-MOS transistor 11 and a drain of the N-MOS transistor 12 is connected to an output line 20 that serves as an output terminal PW. A source of the P-MOS transistor 11 is connected to a signal line hhers. A source of the N-MOS transistor 12 is connected to a terminal that comes to have a reference voltage Vss.

This output line 20 is connected to a drain of an N-MOS transistor 13. A source of the N-MOS transistor 13 is connected to a terminal that comes to have the reference voltage Vss. On the other hand, a series circuit of a NOR-gate 17 and an inverter 18 is connected to a gate of the N-MOS transistor 13. Both a signal line to which a program signal pg is inputted and a signal line to which a read signal read is inputted are connected to the input side of the NOR-gate 17.

The P-MOS transistor 11 of the P-well driver circuit shown in FIG. 1 supplies a P-well voltage to a P-well when an erase pulse is applied to the memory cell array 153.

The N-MOS transistor 13 is to force the P-well to the reference voltage Vss during write of the memory cell array 153 and during read thereof. The N-MOS transistor 13 is a transistor which has a larger driving capacity than that of the N-MOS transistor 12. In the N-MOS transistor 13, the channel length is set minimum and the channel width is set to, for example, 100 μm. This setting of the N-MOS transistor 13 is for increasing the current drawing capacity and for reliably forcing the potential of the P-well to the reference voltage Vss.

On the other hand, the N-MOS transistor 12 is a transistor for applying the erase pulse application to the memory cell array and thereafter discharging the P-well to force the voltage of the P-well to the reference voltage Vss. In the N-MOS transistor 12, its driving capacity is set to about 1/50 of that of the N-MOS transistors 13 in order to slow down the time during which the P-well is forced to the reference voltage Vss.

Figure 19:
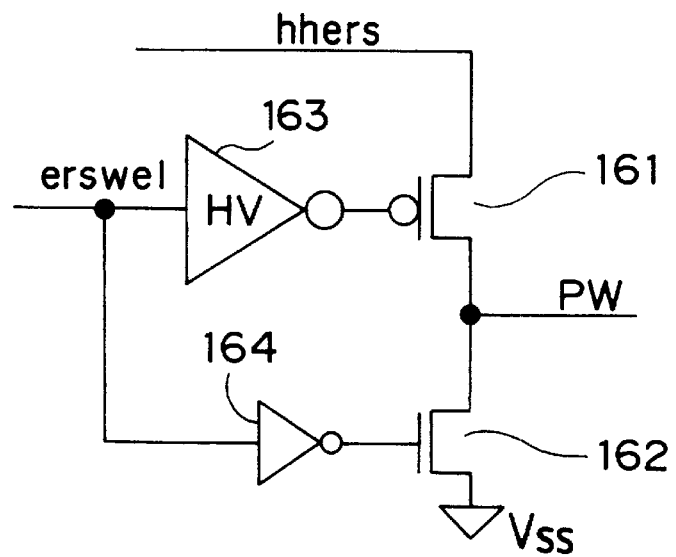
FIG. 19 is a circuit diagram of a prior art P-well driver.
Figure 20:
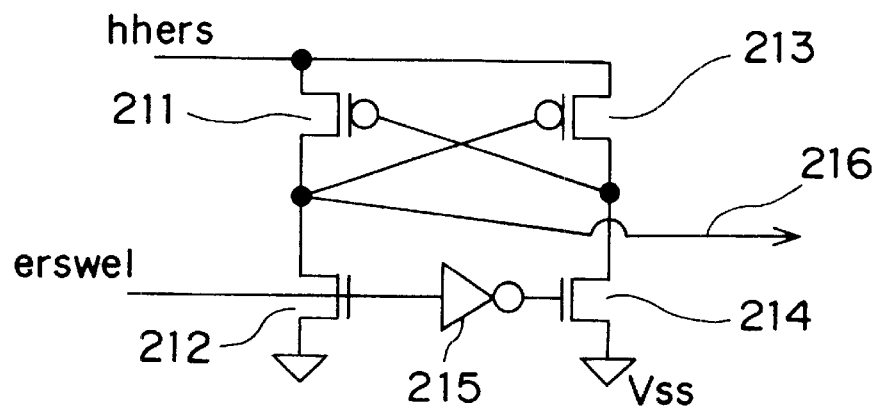
FIG. 20 is a circuit diagram of a high-voltage level shifter.

The P-well driver circuit of this embodiment is provided with a new N-MOS transistor 13, unlike the conventional P-well driver circuit 156 shown in FIG. 19. In the N-MOS transistor 13, the source is connected to the terminal that comes to have the reference voltage Vss, and the drain is connected to the output line 20 connected to the output terminal PW, as stated above. A program signal pg and a read signal read are inputted to the gate of the N-MOS transistor 13 via the NOR-gate 17 and the inverter 18.

The N-MOS transistor 12 is turned on during program operation and during erase operation. The N-MOS transistor 12 is constructed of a transistor whose driving capacity is smaller than that of the N-MOS transistor 13. On the other hand, the N-MOS transistor 13 is turned on during the program and read operations and constructed of a transistor whose driving capacity is greater than that of the N-MOS transistor 12.

The N-MOS transistor 13 is turned on during write when the program signal pg has high level (for example, the power voltage level of not higher than 5 V) or during read when the read signal read has high level (for example, the power voltage level of not higher than 5 V). On the other hand, the N-MOS transistor 13 is put into the OFF state during a time other than when the program signal pg and the read signal read come to have the reference voltage Vss.

Figure 13:
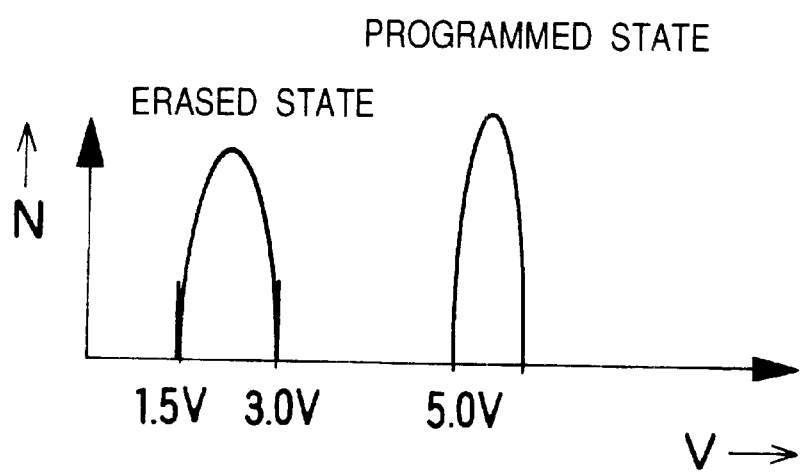
FIG. 13 is a graph showing threshold voltage distributions after each mode in the flash memory.
Figure 14:
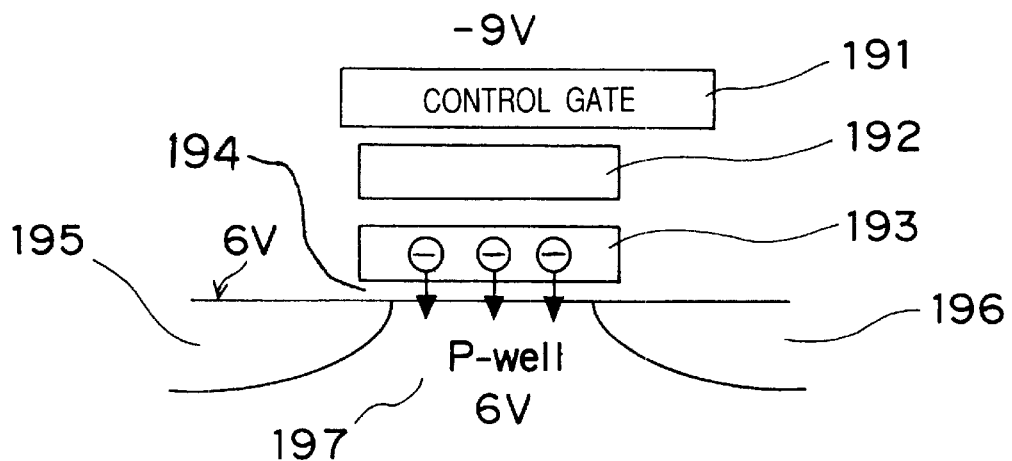
FIG. 14 is a schematic diagram for explaining a channel erase system of a memory cell.
Figure 15:
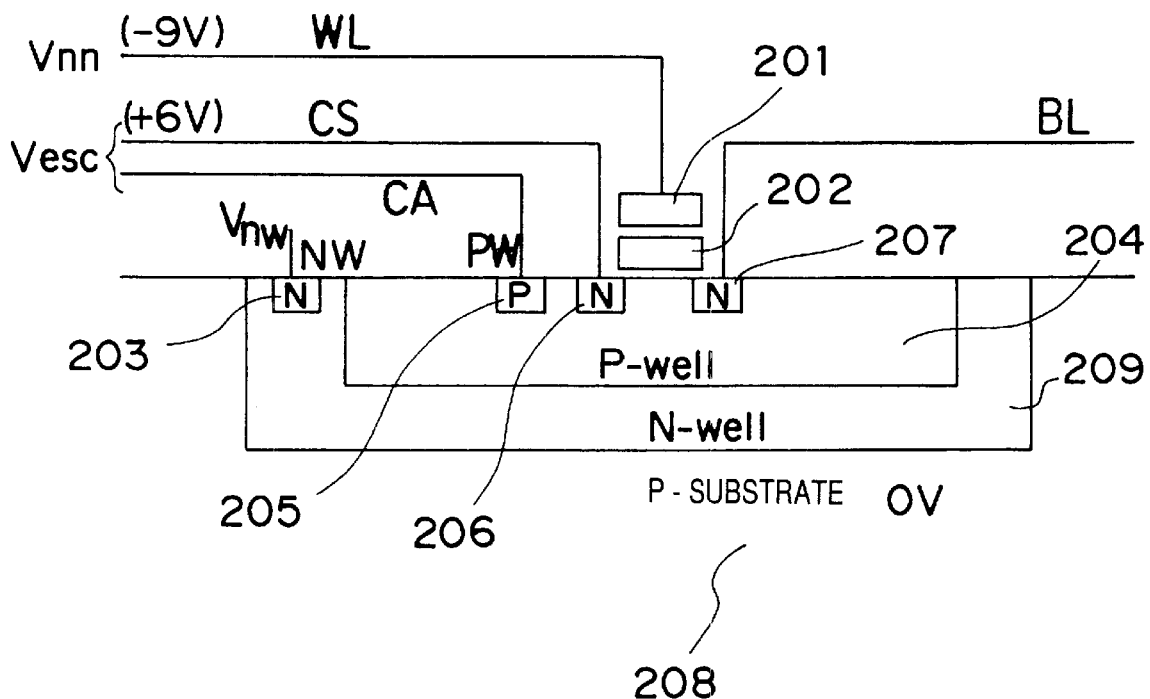
FIG. 15 shows a cross-sectional structural diagram of the above memory cell.

The aforementioned erase operation means the applying of the erase pulse to the memory cell. In erase verify, it is verified whether the memory cell has reached a specified threshold voltage (for example, a voltage of not higher than 3.0 V shown in FIG. 13) after this erase pulse application, and the erase verify generally coincides with the read operation.

Since the erase verify is almost the same as the read operation, that is, since the erase verify is different from the read operation only in the setting the application voltage to the control gate to 3.0 V in Table 2, no description is herein provided.

Accordingly, a shutdown sequence in this embodiment means a process of shifting to the erase verify after the erase pulse application in the erase operation.

In this embodiment, the erase operation is fundamentally similar to the one shown by the prior art example. Therefore, centering on the shutdown sequence, the operation of a P-well driver of this embodiment will be described.

First of all, the erase operation will be described. When the erase operation starts, a signal erswel inputted to the P-well driver of this embodiment comes to have a high level (power voltage level of not higher than 5 V, for example), and then the P-MOS transistor 11 is turned on. Then, a positive voltage hhers (6 V, for example) is outputted to the output terminal PW of the output line 20 of this P-well driver.

Figure 2:
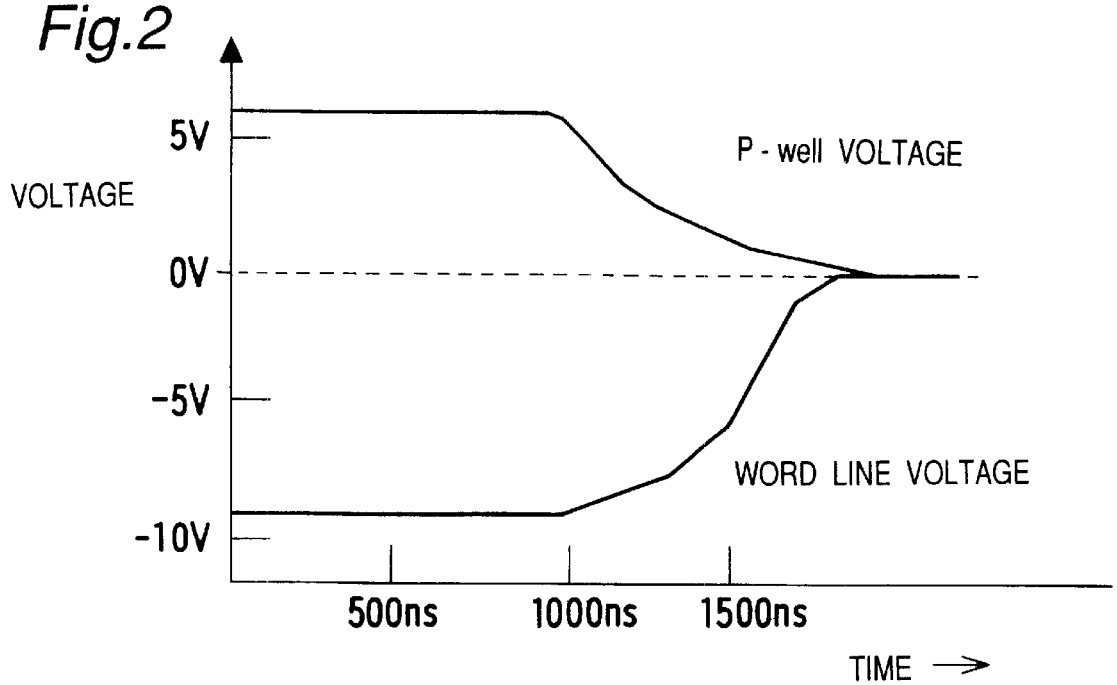
FIG. 2 is a graph of waveforms at nodes in a shutdown sequence during erase in the P-well driver circuit according to the first through fourth embodiments of this invention.

When the erase pulse application ends and the shutdown sequence starts, the signal erswel comes to have L level i.e. the reference voltage Vss level. By this operation, the P-MOS transistor 11 is turned off, and at the same time the N-MOS transistor 12 is turned on. By this operation, the output line 20 of this P-well driver is forced to the reference voltage Vss. At this time, the capacity of the N-MOS transistor 12 is smaller than that of the N-MOS transistor 13 for read and write uses, as described above. Therefore, the fall waveform of the voltage of the P-well becomes a dull waveform as shown in FIG. 2.

As described above, in this embodiment, the voltage of the P-well is forced comparatively slowly to the reference voltage Vss, as compared with the prior art example.

Therefore, the influence due to the capacitive coupling which has been explained in connection with the conventional matter (2) becomes reduced. Therefore, according to the P-well driver of this embodiment, the voltage of the word line WL does not become lower than at least −9.6 V even when the P-well voltage falls.

Figure 24:
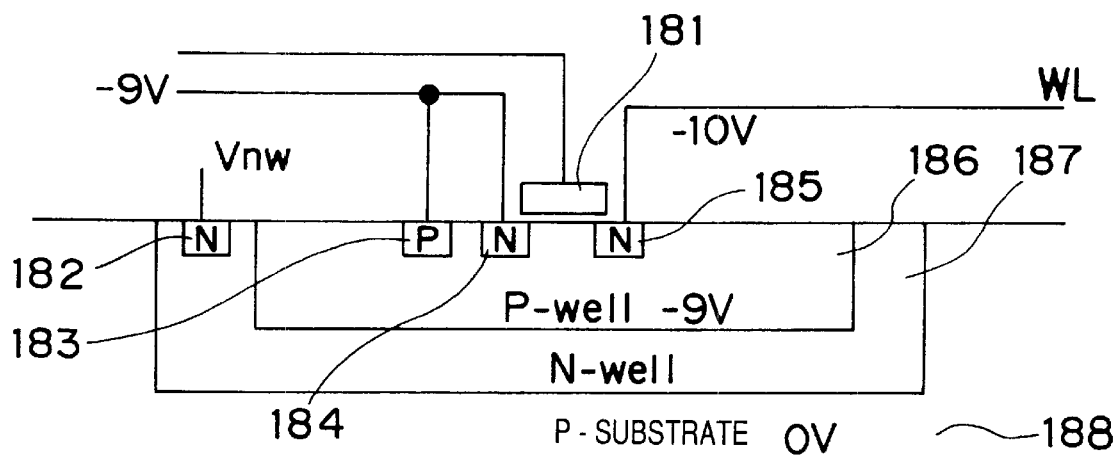
FIG. 24 is a circuit diagram for explaining cause of generation of a forward current in a word line driver circuit during erase.

Therefore, by replacing the P-well driver 156 in the block diagram of FIG. 16 described hereinabove with the P-well driver of this embodiment, there is no possibility of occurrence of the forward bias of the drain 185 and the P-well 186 as shown in FIG. 24 that shows the sectional structure of the N-MOS transistor 222 of the word line driver 152 of FIG. 16. Therefore, occurrence of the aforementioned latch-up can be prevented.

Figure 3:
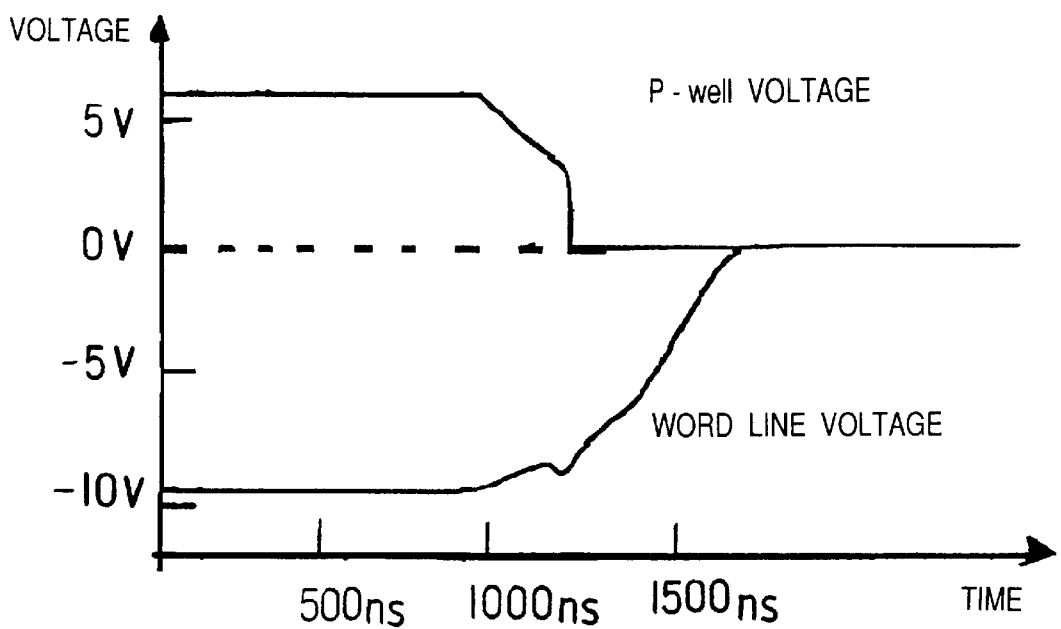
FIG. 3 is a graph of waveforms at nodes in the shutdown sequence during erase of the present invention.

Moreover, the present invention adopts a method for forcing the P-well to the reference voltage Vss by putting the read signal read into "H" state before the P-well is forced to the reference voltage Vss in consideration of a case where the optimization of the size of the transistor for forcing the P-well driver slowly to the reference voltage Vss is difficult. FIG. 3 shows the voltage waveforms at this time. In this case, the word voltage is momentarily forced to a deeper negative voltage. However, since the forcing is less than 0.6 V (not greater than the built-in voltage), there is no possibility of occurrence of latch-up.

Finally, as shown in FIG. 2, the word line voltage is slowly forced to the reference voltage Vss.

In this first embodiment, it is also acceptable to turn on both the N-MOS transistors 12 and 13 during write and during read.

Figure 4:
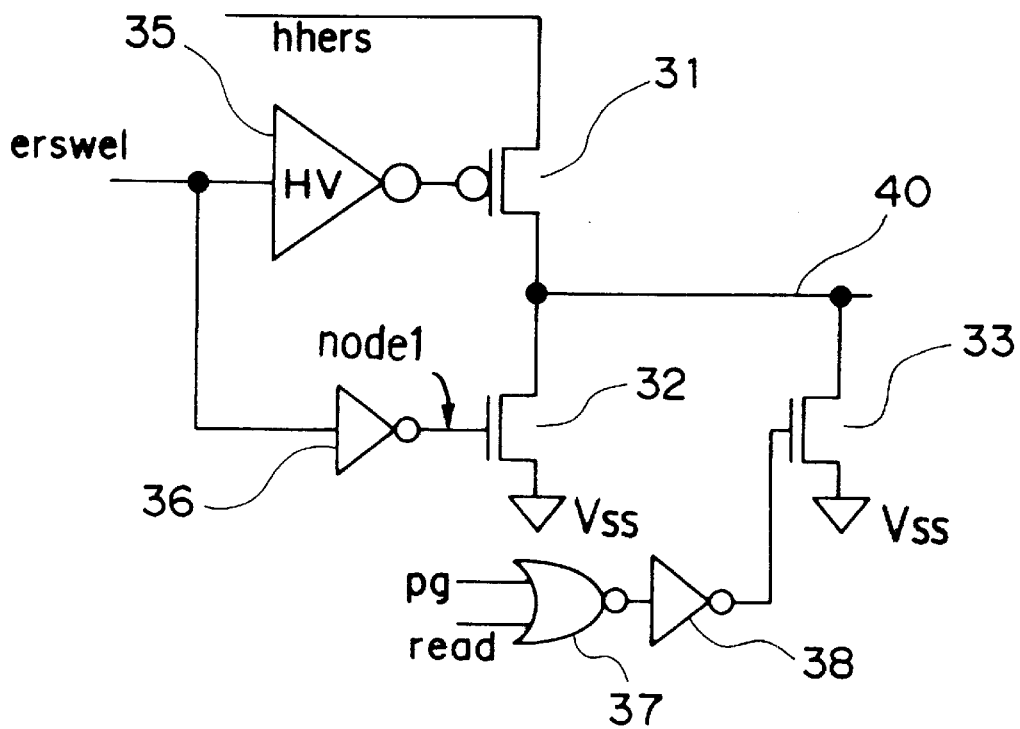
FIG. 4 is a circuit diagram of a P-well driver according to a second embodiment of this invention.

FIG. 4 shows a well voltage setting circuit of the nonvolatile semiconductor memory according to a second embodiment of the present invention. In the second embodiment, there are provided a P-MOS transistor 31, an N-MOS transistor 32, a high-voltage level shifter 35, an N-MOS transistor 33, an inverter 36, a NOR-gate 37 and an inverter 38 in place of the P-MOS transistor 11, the N-MOS transistor 12, the high-voltage level shifter 15, the N-MOS transistor 13, the inverter 16, the NOR-gate 17 and the inverter 18 of the first embodiment. Wiring of the above-mentioned elements is the same as that of the first embodiment.

Similarly to the first embodiment, the erase operation of this second embodiment is fundamentally the same as the prior art example. Therefore, the shutdown sequence operation is also centered in description of the second embodiment.

As shown in FIG. 4, in this second embodiment, there is provided a P-MOS transistor 31 for supplying a well voltage when the erase pulse is applied. There is further provided an N-MOS transistor 33 for forcing the P-well to the reference voltage Vss during write and during read. This N-MOS transistor 33 is a transistor which has a larger driving capacity than that of the N-MOS transistor 32 in order to force the P-well to the reference voltage Vss during write and during read. In the N-MOS transistor 33, the channel length is minimum and the channel width is set to for example 100 μm. This Setting of the N-MOS transistor 33 is for increasing the current drawing capacity and for reliably forcing the potential of the P-well to the reference voltage Vss.

Moreover, the N-MOS transistor 32 discharges the P-well and forces the voltage of the P-well to the reference voltage Vss during the erase operation. This N-MOS transistor 32 has its driving capacity set to about 1/10 of that of the transistors 33. With this arrangement, the voltage of the P-well is gradually (slowly) forced to the reference voltage Vss, as compared with the prior art example.

Figure 5:
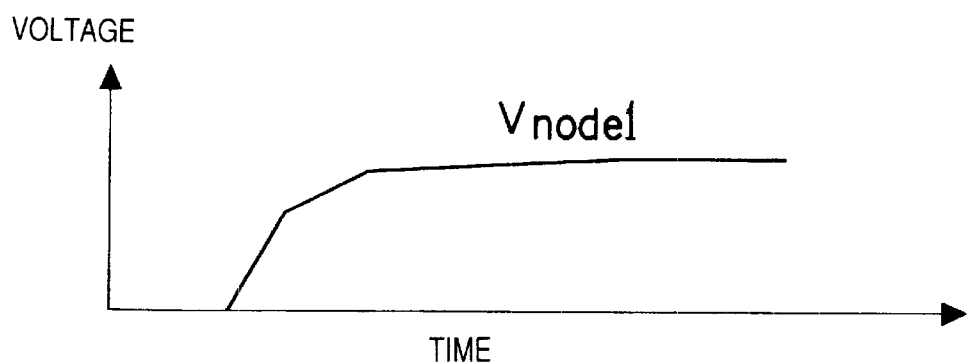
FIG. 5 is a graph of a voltage waveform at the node 1 according to the second embodiment.
Figure 21:
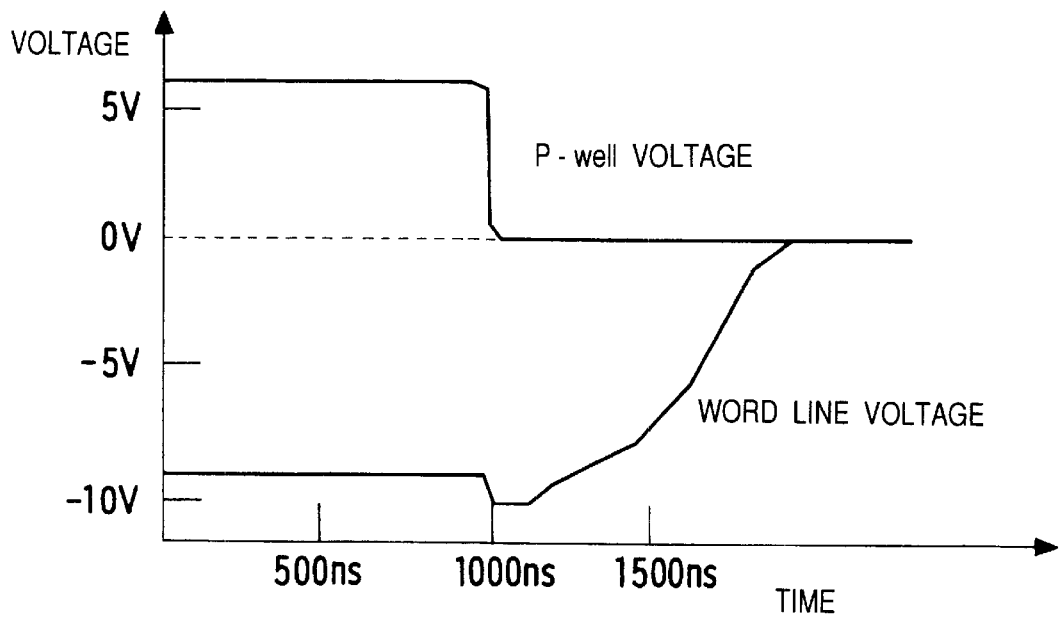
FIG. 21 is a graph of waveforms at nodes in the shutdown sequence during erase in a prior art system.
Figure 22:
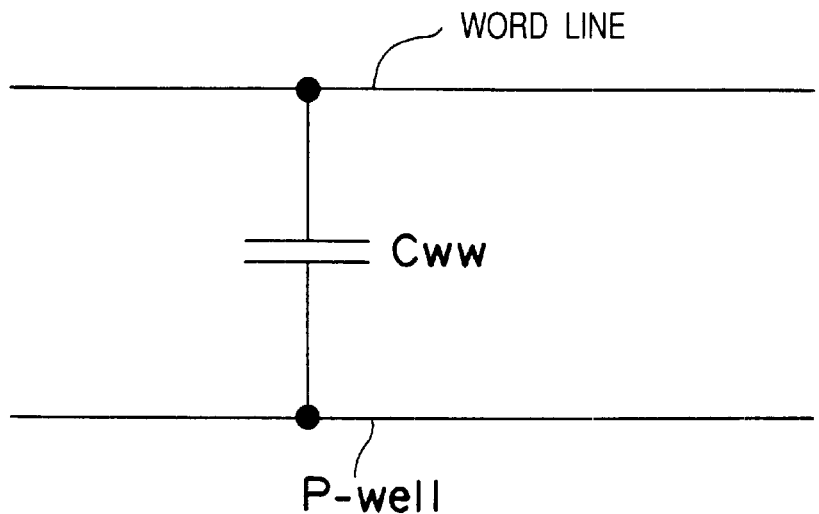
FIG. 22 is an equivalent circuit diagram of a memory array.
Figure 23:
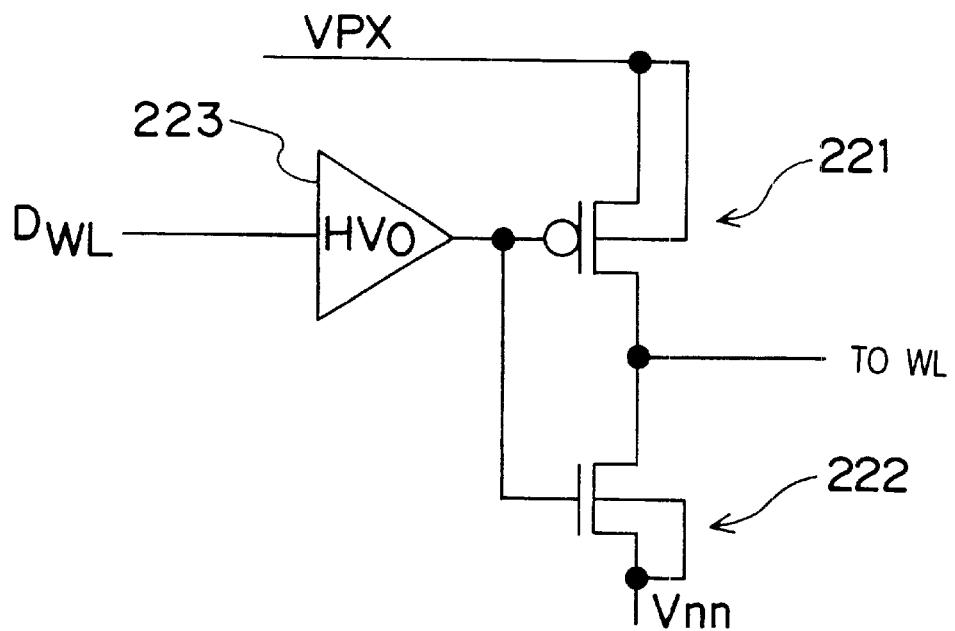
FIG. 23 is a circuit diagram of a word line driver.

Furthermore, in this second embodiment, an N-MOS transistor and a P-MOS transistor constitutes the inverter 36, and the size of the P-MOS transistor is made smaller than that of the N-MOS transistor. That is, the size of the P-MOS transistor of this inverter 36 is made smaller than that of a P-MOS transistor of the inverter 16 of the first embodiment. This reduces the capacity of the transistor 32 during the discharge of the P-well in the erase operation. As shown in FIG. 5, the rise of a voltage Vnode1 at a connection point (a node 1) of the inverter 36 and the gate of the transistor 32 is made gradual (not shorter than 100 nanoseconds). With this arrangement, as shown in FIG. 2, the discharge curve of the P-well voltage after the erase pulse application can be more gradual in than in the prior art example shown in FIG. 21.

The erase operation of this embodiment will be described next. When the erase operation starts, in a P-well driver of this embodiment, the signal erswel comes to have H level, the P-MOS transistor 31 is turned on and a positive voltage (6 V, for example) is outputted from an output line 40 to the output terminal PW. Then, a shutdown sequence starts when this pulse application ends, and therefore, the signal erswel comes to have L level. By this operation, the P-MOS transistor 31 is turned off, and at the same time the N-MOS transistor 32 is turned on. By this operation, the P-well is forced to the reference voltage Vss.

At this time, the capacity of the N-MOS transistor 32 is smaller than that of the N-MOS transistor 33, and the rise time to the ON state is long, as shown in FIG. 5. Therefore, the voltage waveform of the P-well becomes a waveform as shown in FIG. 2.

Moreover, the present invention adopts the method for forcing the P-well to the reference voltage Vss by putting the read signal read into "H" state before the P-well is forced to the reference voltage Vss in consideration of the case where the optimization of the size of the transistor for forcing the P-well driver slowly to the reference voltage Vss is difficult. FIG. 3 shows the voltage waveforms at this time. In this case, the word voltage is momentarily forced to a deeper negative voltage. However, since the forcing is less than 0.6 V (not greater than the built-in voltage), there is no possibility of occurrence of latch-up.

As described above, according to this second embodiment, the P-well can be forced to the reference voltage Vss more gradually than in the conventional case. Therefore, the aforementioned influence of the capacitive coupling of the word line WL with the P-well becomes small. Therefore, according to this embodiment, the voltage of the word line WL does not become lower than at least −9.6 V at the fall time of the P-well voltage.

Therefore, when the P-well driver of this embodiment is used instead of the P-well driver 156 of the block diagram of FIG. 16 described hereinabove, there is no possibility of occurrence of such a forward bias as that of the drain 185 and the P-well 186 as shown in FIG. 24 that shows the sectional structure of the word line driver 152 of FIG. 16. Therefore, the occurrence of the latch-up can be prevented. Then, finally, as shown in FIG. 2, the word line voltage is slowly forced to the reference voltage Vss.

Figure 6:
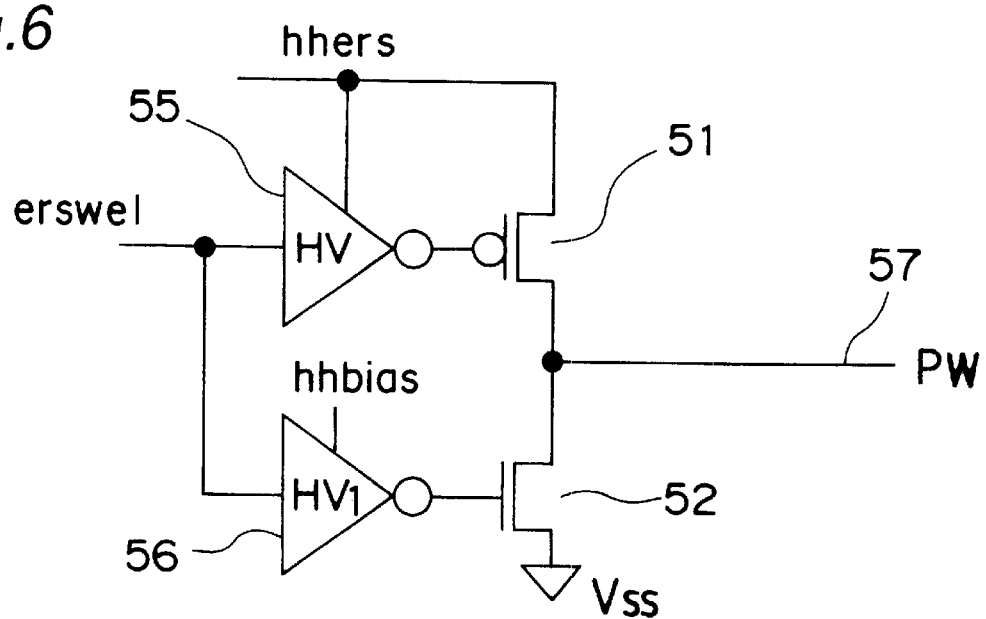
FIG. 6 is a circuit diagram of a P-well driver according to a third embodiment of this invention.

FIG. 6 shows a third embodiment of this invention. A P-well driver of the third embodiment is provided with a first high-voltage level shifter 55 and a second high-voltage level shifter 56. A gate of a P-MOS transistor 51 is connected to the output side of the first high-voltage level shifter 55. A gate of a N-MOS transistor 52 is connected to the output side of the second high-voltage level shifter 56.

A signal line to which a signal erswel is inputted is connected to the input sides of the first and second high-voltage level shifters 55 and 56. A signal line hhers is connected to the first high-voltage level shifter 55. The signal line hhers is connected to a source of the P-MOS transistor 51. A drain of the P-MOS transistor 51 is connected to a drain of the N-MOS transistor 52. Then, a line connecting both the drains is connected to an output line 57. The output line 57 is connected to a terminal PW connected to the P-well.

Figure 7:
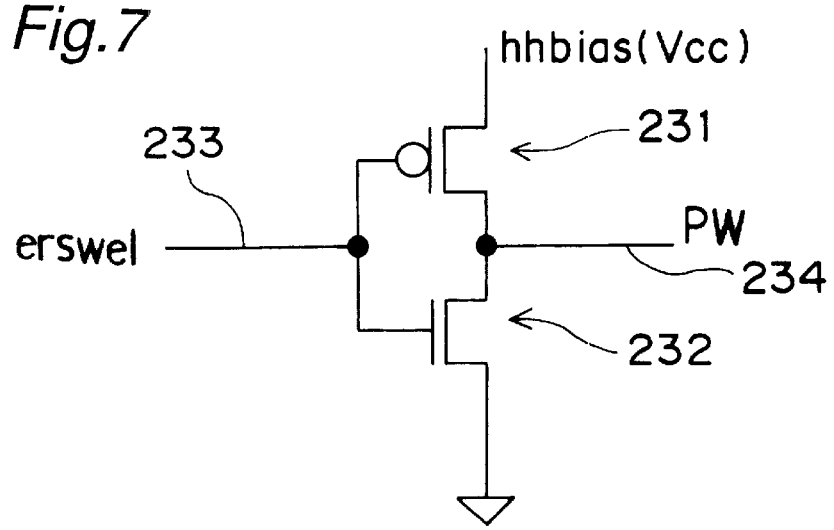
FIG. 7 is a circuit diagram of another high-voltage level shifter according to the third and fifth embodiments.

A signal line hhbias is connected to the second high-voltage level shifter 56. As shown in FIG. 7, this second high-voltage level shifter 56 is constructed of a P-MOS transistor 231 and an N-MOS transistor 232. Gates of the transistors 231 and 232 are connected to a signal line 223 to which the input signal erswel is inputted. Drains of the transistors 231 and 232 are connected to a signal line 234 connected to the terminal PW. A source of the transistor 231 is connected to the signal line hhbias. A source of the transistor 232 is connected to a terminal that comes to have the reference voltage Vss.

In the third embodiment, the erase operation is fundamentally the same as that described in the prior art example. The shutdown sequence operation is also centered in description of the third embodiment.

As shown in FIG. 6, the P-MOS transistor 51 which a P-well driver of the third embodiment has is to supply the well voltage during erase pulse application. The N-MOS transistor 52 is to force the P-well to the reference voltage Vss in the shutdown sequence during write, read and after the erase pulse application.

This N-MOS transistor 52 is a transistor which has a larger driving capacity for forcing the P-well to the reference voltage Vss during write and during read. In the N-MOS transistor 52, the channel length is minimum and the channel width is set to, for example, 100 μm. This setting of the N-MOS transistor 52 is for increasing the current drawing capacity and for reliably forcing the potential of the P-well to the reference voltage Vss.

The third embodiment differs from the first and second embodiments in that the second level shifter 56 for driving the N-MOS transistor 52 is provided.

As shown in FIG. 7, this second level shifter 56 may be constructed of an inverter in which the signal line hhbias is connected to the source of the P-MOS transistor 231 and the source of the N-MOS transistor 232 is connected to the terminal that comes to have the reference voltage Vss. The P-MOS transistor 231 and the N-MOS transistor 232 have their drains connected together to the terminal PW and have their gates connected together to receive the signal erswel as an input. During write and during read, the power voltage Vcc or a voltage higher than the voltage Vcc is applied to the signal line hhbias.

On the other hand, by applying a voltage of about 1 V to the signal line hhbias during the erase operation, the capacity of the N-MOS transistor 52 is reduced to make the discharge voltage waveform of the P-well be a waveform more gradual than in the prior art example, as shown in FIG. 2.

Moreover, the present invention adopts the method for forcing the P-well to the reference voltage Vss by putting the read signal read into "H" state before the P-well is forced to the reference voltage Vss in consideration of the case where the optimization of the size of the transistor for forcing the P-well driver slowly to the reference voltage Vss is difficult.

FIG. 3 shows the voltage waveforms at this time. In this case, the word voltage is momentarily forced to a deeper negative voltage. However, since the forcing is less than 0.6 V (not greater than the built-in voltage), there is no possibility of occurrence of latch-up.

Next, the erase operation of the third embodiment will be described. When this erase operation starts, the signal erswel comes to have H level in this P-well driver, and the P-MOS transistor 51 is turned on to output a positive voltage (6 V, for example) to the output terminal PW connected to the output line 57. Then, if the pulse application of this erase operation ends, then the shutdown sequence starts, and the signal erswel comes to have L level. By this operation, the P-MOS transistor 51 is turned off, and at the same time the N-MOS transistor 52 is turned on.

By this operation, the P-well is forced to the reference voltage Vss. At this time, the voltage of the signal line hhbias becomes about 1 V, as described above, and the capacity of the N-MOS transistor 52 is reduced. Therefore, the voltage waveform of the P-well becomes a waveform shown in FIG. 2. As shown in FIG. 2, the voltage waveform of the P-well forced to the reference voltage Vss is more gradual (slower) than in the prior art example. Therefore, the influence of the capacitive coupling as described above is small, and the voltage of the word line WL does not become lower than at least −9.6 V.

Therefore, by replacing the P-well driver 156 of the block diagram of FIG. 16 described hereinabove with the P-well driver of this embodiment, there is no possibility of occurrence of the forward bias of the drain 185 and the P-well 186 as shown in FIG. 24 that shows the sectional structure of the N-MOS transistor 222 of the word line driver 152 of FIG. 16. Therefore, the occurrence of the aforementioned latch-up can be prevented.

Finally, as shown in FIG. 2, the word line voltage is slowly forced to the reference voltage Vss.

The P-well driver of the third embodiment is required only to add the inversion level shifter 56 having a simple inverter structure to the P-well driver set every block. Accordingly, there is almost no concern about occurrence of an increase in the chip area.

Figure 8:
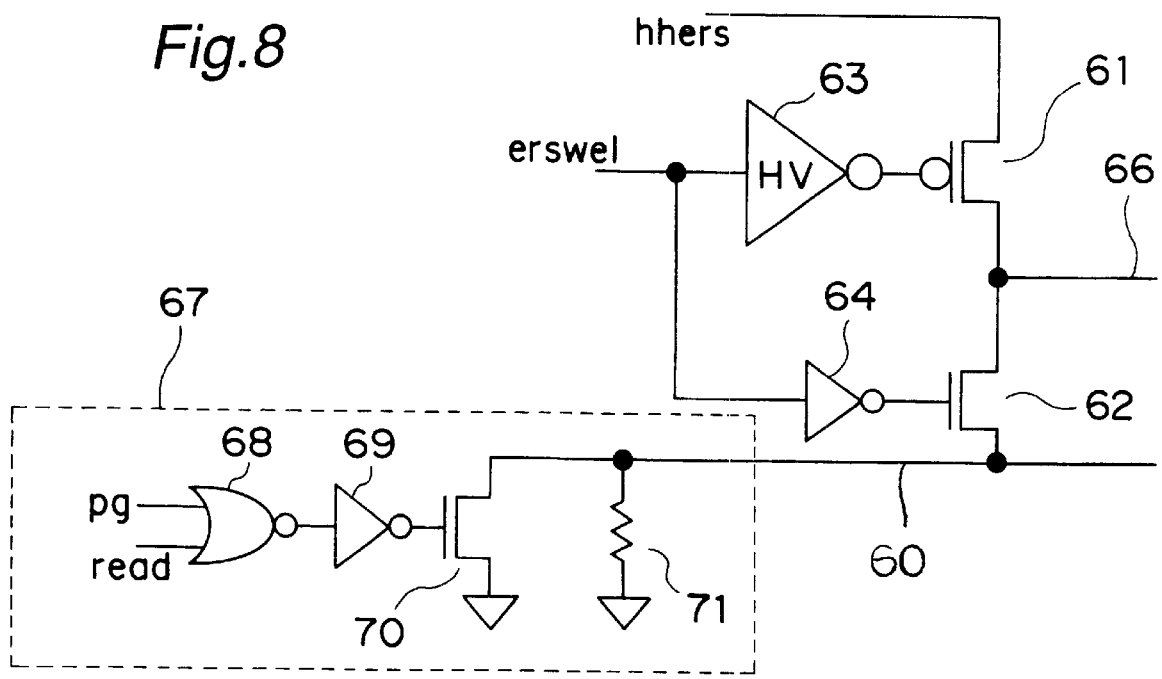
FIG. 8 is a circuit diagram of a P-well driver according to a fourth embodiment of this invention.

FIG. 8 shows a fourth embodiment of this invention. In the fourth embodiment, a drain of a P-MOS transistor 61 is connected to a drain of an N-MOS transistor 62. A connection line between the drains is connected to an output line 66. A source of the N-MOS transistor 61 is connected to a signal line hhers, and a gate of the N-MOS transistor 61 is connected to the output side of a high-voltage level shifter 63. The input side of the high-voltage level shifter 63 is connected to a signal line to which a signal erswel is inputted. This signal line is connected to the input side of an inverter 64. The output side of the inverter 64 is connected to a gate of the N-MOS transistor 62. A source of the N-MOS transistor 62 is connected to a circuit 67 by way of an input power line 60.

The circuit 67 is provided with an OR-gate 68 to which a signal pg and a signal read are inputted, an inverter 69 which is connected in series with the OR-gate 68, and an N-MOS transistor 70 whose gate is connected to the output side of the inverter 69. A drain of the N-MOS transistor 70 is connected to the source of the N-MOS transistor 62. A source of the transistor 70 is connected to a terminal to which the reference voltage Vss is applied. The drain of the transistor 70 is connected to a resistor 71. The resistor 71 is connected to a terminal to which the reference voltage Vss is applied.

In a P-well driver of this fourth embodiment, the erase operation is fundamentally the same as that described in the prior art example. Therefore, the shutdown sequence operation will mainly be described.

The P-well driver of the fourth embodiment has the P-MOS transistor 61 for supplying the well voltage when the erase pulse is applied, as shown in FIG. 8. Moreover, this P-well driver is provided with an N-MOS transistor 70 for forcing the P-well to the reference voltage Vss during write and during read.

The N-MOS transistor 70 is a transistor which has a larger driving capacity for forcing the P-well to the reference voltage Vss during write and during read, similarly to the N-MOS transistor 62. This N-MOS transistor 70 has a minimum channel length and a channel width set to, for example, 100 μm. This setting of the N-MOS transistor 70 is for increasing the current drawing capacity and for reliably forcing the potential of the P-well to the reference voltage Vss.

The N-MOS transistor 62 is arranged every block, and only one N-MOS transistor 70 is provided for all the blocks.

It is to be noted that the N-MOS transistor 62 and the N-MOS transistor 70 are both put into the ON state during write and during read, and a current flows through the output line 66 via both the transistors 70 and 62. Therefore, the transistor 62 is a transistor that has a large driving capacity similar to that of the transistor 70.

In this embodiment, a current flows through the output line 66 via the resistor 71 and the N-MOS transistor 62 in the shutdown sequence after the erase pulse application during the erase operation. Therefore, the current is limited by this resistor 71.

The resistor 71 and the transistor 70 are common to all the blocks, and the addition of this circuit 67 leads to a little increase in the layout area.

This circuit 67 turns on the transistor 70 in order to increase the capacity of forcing the P-well to the reference voltage Vss during write and during read. On the other hand, during the erase operation, the N-MOS transistor 70 is turned off in order to make the discharge gradual (slow). The discharge of the P-well to the reference voltage Vss is performed via the resistor 71 and the N-MOS transistor 62. The discharge waveform of this P-well becomes a more gradual discharge waveform than in the conventional case as shown in FIG. 2.

Moreover, the present invention adopts the method for forcing the P-well to the reference voltage Vss by putting the read signal read into "H" state before the P-well is forced to the reference voltage Vss in consideration of the case where the optimization of the size of the transistor for forcing the P-well driver slowly to the reference voltage Vss is difficult. FIG. 3 shows the voltage waveforms at this time. In this case, the word voltage is momentarily forced to a deeper negative voltage. However, since the forcing is less than 0.6 V (not greater than the built-in voltage), there is no possibility of the occurrence of latch-up.

Figure 9:
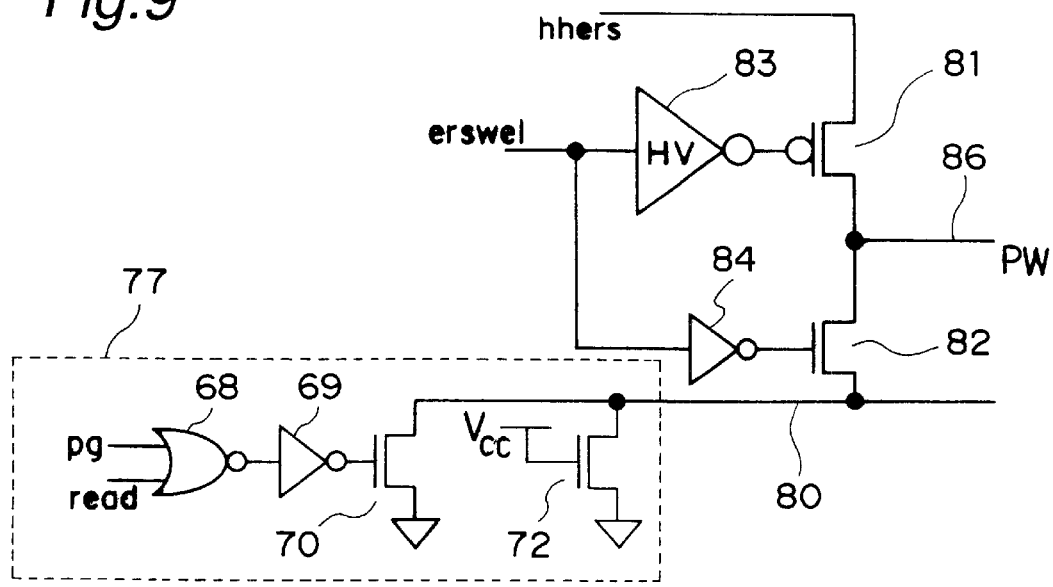
FIG. 9 is a circuit diagram of a P-well driver according to a modification example of the fourth embodiment.

Next, FIG. 9 shows a modification example of the aforementioned fourth embodiment. In this modification example, a circuit 77 is provided in place of the circuit 67. This circuit 77 is a circuit in which the resistor 71 of the circuit 67 is replaced by an N-MOS transistor 72. It is to be noted that a high-voltage level shifter 83, a P-MOS transistor 81, an N-MOS transistor 82 and an inverter 84 are the same as the high-voltage level shifter 63, the P-MOS transistor 61, the N-MOS transistor 62 and the inverter 64, respectively, described hereinabove.

As shown in FIG. 9, this modification example is provided with a P-MOS transistor 81 for supplying the well voltage during erase and an N-MOS transistor 70 for forcing the P-well to the reference voltage Vss during write and during read. The N-MOS transistor 70 has a capacity larger than that of the N-MOS transistor 72 in order to force the P-well to the reference voltage Vss during write and during read. In the N-MOS transistor 70, the channel length is set minimum and the channel width is set to, for example, 100 μm. This setting of the N-MOS transistor 70 is for increasing the current drawing capacity and for reliably forcing the potential of the P-well to the reference voltage Vss.

As shown in FIG. 9, the N-MOS transistor 70 that has the large capacity and the N-MOS transistor 72 that has a small current limiting capacity and replaced by the resistor 71 are connected parallel to a connection line (input power line) 80 located on the source side of the N-MOS transistor 82. The transistors 70 and 72 are common to all the blocks, and the addition of this circuit 77 leads to a little increase in the layout area.

In order to increase the capacity of forcing the P-well potential to the reference voltage Vss during write and during read in this circuit 77, the N-MOS transistor 70 is turned on during erase, in order to slow down the discharge of the P-well, the N-MOS transistor 70 is turned off, and only the N-MOS transistor 72 whose transistor capacity is about 1/50 of that of the transistor 70 is turned on. Therefore, the discharge of this P-well to the reference voltage Vss is performed only by the N-MOS transistor 72 via the N-MOS transistor 82. By this operation, the discharge waveform of the voltage of the P-well is made more gradual than in the prior art example, as shown in FIG. 2.

Next, the erase operation will be described. When this erase operation starts, the signal erswel comes to have H level in this P-well driver. Thereby, the P-MOS transistor 81 is turned on and a positive voltage (6 V, for example) is outputted to the terminal PW connected to an output line 86. When the pulse application ends and the shutdown sequence starts, the signal erswel comes to have L level. By this operation, the P-MOS transistor 81 is turned off and at the same time the N-MOS transistor 82 is turned on.

By this operation, in the circuit of FIG. 9, the P-well is forced to the reference voltage Vss via the transistor 72. At this time, due to the small driving capacity of the transistor 72, as described above, the waveform of the voltage of the P-well becomes more gradual than in the conventional case, as shown in FIG. 2. Since the waveform of forcing this P-well voltage to the reference voltage Vss is more gradual than in the conventional case, the influence due to the aforementioned capacitive coupling is small, and the voltage of the word line WL does not become lower than at least −9.6 V. Therefore, by replacing the P-well driver 156 in the block diagram of FIG. 16 described hereinabove with the P-well driver of this embodiment, there is no possibility of occurrence of the forward bias of the drain 185 and the P-well 186 as shown in FIG. 24 that shows the sectional structure of the N-MOS transistor 222 of the word line driver 152 of FIG. 16. Therefore, the occurrence of the aforementioned latch-up can be prevented.

Finally, as shown in FIG. 2, the voltage of the word line WL is slowly forced to the reference voltage Vss.

In the fourth embodiment and the modification example thereof, there is no addition of a transistor to each block, dissimilar to the first and second embodiments, and it is only required to add the circuit 67 or the circuit 77 common to all the blocks. Therefore, an increase in the layout area can be restrained.

Figure 10:
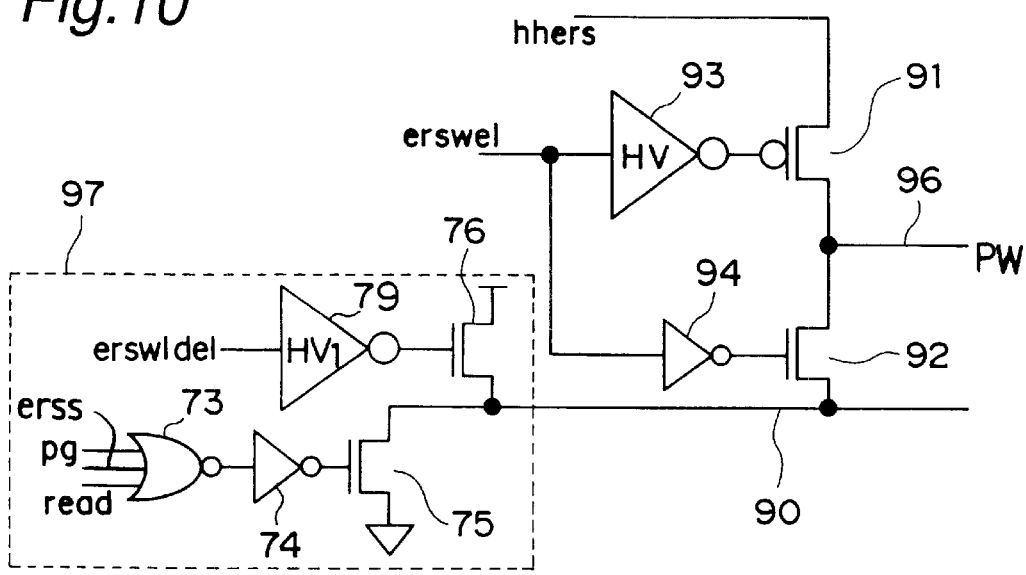
FIG. 10 is a circuit diagram of a P-well driver according to a fifth embodiment of this invention.

Next, FIG. 10 shows a circuit of a P-well driver of a fifth embodiment of this invention. The P-well driver of the fifth embodiment differs from the fourth embodiment in that a circuit 97 is provided in place of the circuit 67 of the fourth embodiment shown in FIG. 8.

A high-voltage level shifter 93, a P-MOS transistor 91, an N-MOS transistor 92 and an inverter 94 are the same as the high-voltage level shifter 63, the P-MOS transistor 61, the N-MOS transistor 62 and the inverter 64, respectively, of the fourth embodiment.

In this circuit 97, the output side of a high-voltage level shifter 79 is connected to a gate of a N-MOS transistor 76, and the input side of this high-voltage level shifter 79 is connected to a signal line that transmits a signal erswldel. A drain of the N-MOS transistor 76 is connected to a terminal that comes to have the power voltage Vcc, and a source of the N-MOS transistor 76 is connected to a connection line 90. This connection line 90 is connected to a source of the N-MOS transistor 92. Moreover, this connection line 90 is connected to a drain of the N-MOS transistor 75. A source of the N-MOS transistor 75 is connected to a terminal that comes to have the reference voltage Vss. A gate of the N-MOS transistor 75 is connected to the output side of a series circuit of a NOR-gate 73 and an inverter 74. To the input side of this NOR-gate 73 are connected a signal line for transmitting a signal pg, a signal line for transmitting a signal read and a signal line for transmitting a signal erss.

This fifth embodiment differs from the fourth embodiment in the main point that an N-MOS transistor 76 in place of the resistor 71 is connected to the connection line 90 that serves as a common well line.

As stated above, the source of the N-MOS transistor 76 is connected to the common well line 90, the drain of the N-MOS transistor 76 is connected to the terminal that comes to have the power voltage Vcc (2 to 3 V, for example, in this case) and the gate of the N-MOS transistor 76 is connected to an output of the inversion type high-voltage level shifter circuit 79.

A signal erwldel is inputted to the input side of the inversion type high-voltage level shifter circuit 79. The N-MOS transistor 76 is turned on when this signal erwldel has high level (power voltage level), and the transistor 76 is put into the OFF state when the signal erwldel has L level (reference voltage level).

The inversion type high-voltage level shifter circuit 79 performs conversion of the high level to almost same level or a level not higher than the input voltage level. Therefore, the circuit can be constructed of a simple circuit construction of the same inverter construction as that of the inversion type high-voltage level shifter circuit 56 shown in FIG. 6 described hereinabove. Consequently, there is no problem of an increase in the chip area.

The NOR-gate 73 is a triple-input gate. In addition to the signal pg and the signal read, the signal erss is inputted to the gate. The signal pg comes to have high level during write, and the signal read comes to have high level during read. The signal erss is a signal for turning on the N-MOS transistor 75 after the signal erwldel falls to L level in the shutdown sequence after the erase pulse application during erase.

In this fifth embodiment, the erase operation is fundamentally similar to the operation shown in connection with the prior art example. Therefore, the operation of the P-well driver of this embodiment will be described centering on the shutdown sequence operation.

As shown in FIG. 10, the P-MOS transistor 91 is a transistor for supplying the well voltage during the erase pulse application. The N-MOS transistor 75 is a transistor for forcing the P-well to the reference voltage Vss during write and during read. This N-MOS transistor 75 has a larger driving capacity than that of the N-MOS transistor 76 in order to force the P-well to the reference voltage Vss during write and during read. In the N-MOS transistor 75, the channel length is minimum and the channel width is set to, for example, 100 μm. This setting of the N-MOS transistor 75 is for increasing the current drawing capacity and for reliably forcing the potential of the P-well to the reference voltage Vss.

As shown in FIG. 10, the N-MOS transistor 75 that has a large driving capacity and the N-MOS transistor 76 for forcing to the power voltage Vcc are connected to the source side of the N-MOS transistor 92. The N-MOS transistor 76 has a driving capacity of about 1/50 of that of the N-MOS transistor 75. The transistors 75 and 76 are common to all the blocks. The addition of this circuit 97 leads to a little increase in the layout area. This circuit 97 increases the capacity of forcing the P-well potential to the reference voltage Vss by turning on the transistor 75 during write and during read.

Figure 11:
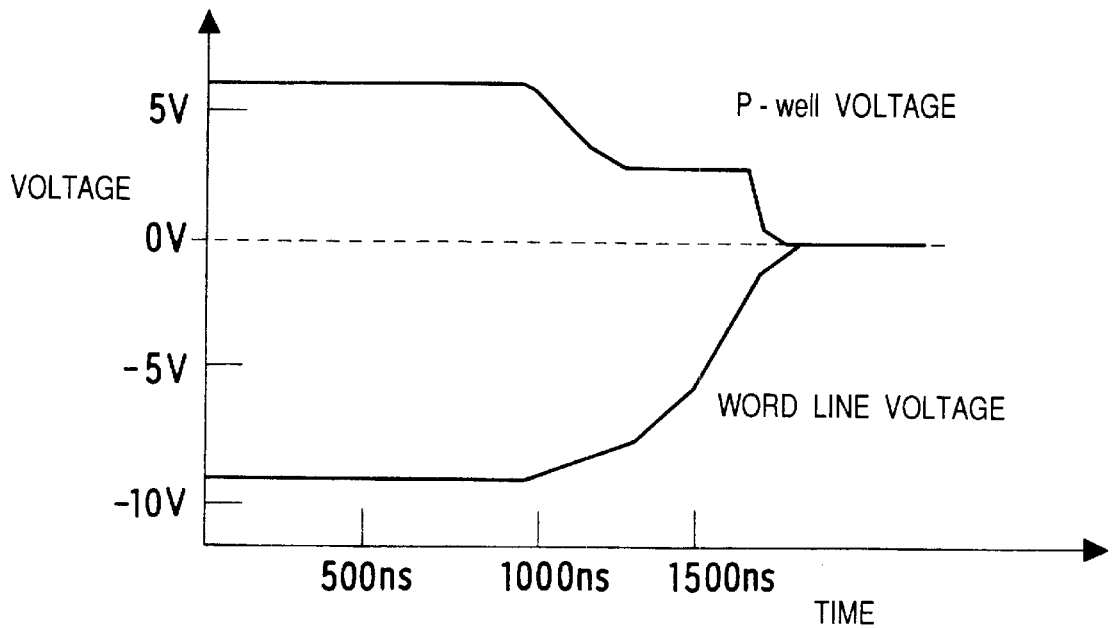
FIG. 11 is a graph of waveforms at nodes in the shutdown sequence during erase in the fifth embodiment.
Figure 12:
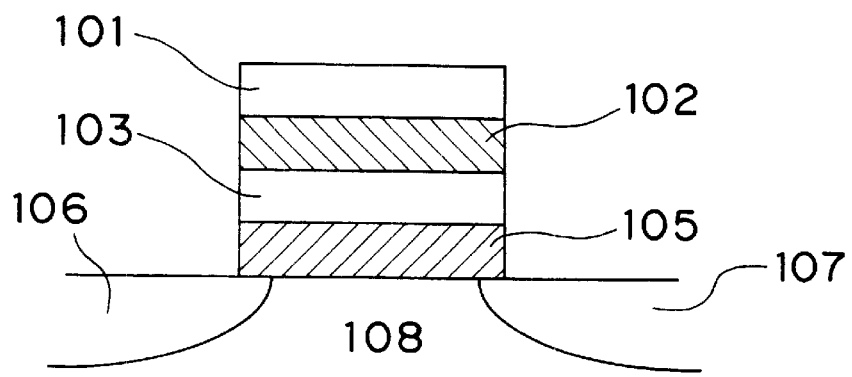
FIG. 12 is a structural diagram of a flash memory cell.

After the erase pulse application during erase, the N-MOS transistor 76 is turned on by making the signal erswldel have high level, so that the P-well potential is once forced to the power voltage Vcc. Thereafter, the transistor 76 is turned off to discharge the P-well through the transistor 75, so that the P-well potential is forced to the reference voltage Vss. Consequently, the discharge curve of the voltage of the P-well becomes a curve that falls steeply after a period during which the curve becomes flat partway as shown in FIG. 11 instead of the continuous gentle curve shown in FIG. 8.

Next, the erase operation will be described. When this erase operation starts, the signal erwsel comes to have H level and the P-MOS transistor 91 is turned on to output a positive voltage (6 V, for example) to the terminal PW connected to an output line 96. Thereafter, the signal ersweldel comes to have H level after a delay of about 200 ns (nanoseconds), and the common well line 90 comes to have the power voltage Vcc. Next, when the pulse application ends and the shutdown sequence starts, the signal erswel comes to have L level. By this operation, the P-MOS transistor 91 is turned off, and at the same time the N-MOS transistor 92 is turned on. By this operation, the output terminal PW (i.e., the word line WL) is once forced to the power voltage Vcc. Subsequently, the signal erswldel comes to have L level, the transistor 76 is turned off, and then the signal erss comes to have high level. Therefore, the common well line 90 rapidly comes to have the reference voltage Vss, and finally, the waveform of the P-well voltage becomes the waveform shown in FIG. 11. When this shutdown sequence ends, the signal erss returns to L level.

In this embodiment, the waveform of forcing the P-well voltage to the reference voltage Vss becomes a form stepped toward the reference voltage Vss. Therefore, the influence of the aforementioned capacitive coupling is a little, and the voltage of the word line does not become lower than at least −9.6 V.

Therefore, by replacing the P-well driver 156 in the block diagram of FIG. 16 described hereinabove with the P-well driver of this embodiment, there is no possibility of occurrence of the forward bias of the drain 185 and the P-well 186 as shown in FIG. 24 that shows the sectional structure of the N-MOS transistor 222 of the word line driver 152 of FIG. 16. Therefore, occurrence of the aforementioned latch-up can be prevented.

Finally, as shown in FIG. 11, the word line voltage is slowly forced to the reference voltage Vss.

In the fifth embodiment, the electric discharge can be made slower than those in the first through fourth embodiments, by which the voltage drop due to the aforementioned capacitive coupling can be prevented. In the fifth embodiment, the P-well voltage was once made to be a potential intermediate between the erase voltage and the reference voltage Vss, and thereafter discharged to the reference voltage Vss. According to the above description, the intermediate voltage is set to the power potential Vcc (2 to 3 V, for example). However, it is acceptable to adopt a system of achieving the discharge in two or more steps of intermediate potentials by providing, for example, a voltage of 6 V for the voltage during erase, a voltage of 4 V for a first intermediate potential, a voltage of 2 V for a second intermediate potential and finally the power potential Vss.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A well voltage setting circuit of a nonvolatile semiconductor memory, comprising:

floating-gate field-effect transistors able to electrically write and erase information, the floating-gate field-effect transistors being each provided with a control gate, a floating gate, a drain and a source, and arranged in rows and columns into a block to form a memory cell array;

a plurality of row lines each connected to control gates of the floating-gate field-effect transistors in each row;

a plurality of column lines each connected to drains of the floating-gate field-effect transistors in each column;

a source line connected commonly to sources of the floating-gate field-effect transistors in the block;

a first voltage supply circuit for applying a first voltage to a well which constitutes each of channel regions in arrangement of the memory cell array to be erased when an erase pulse is applied to the memory cell array in an erase operation wherein information of the memory cell array is erased on a block basis by channel erase using a Fowler-Nordheim tunneling phenomenon;

a second voltage supply circuit for applying a reference voltage to the well when the erase pulse application ends; and a third voltage supply circuit for applying the reference voltage to the well during write and during read.

2. The nonvolatile semiconductor memory well voltage setting circuit as claimed in claim 1, wherein the first voltage supply circuit is constructed of a P-MOS transistor, and the second and third voltage supply circuits are each constructed of an N-MOS transistor.

3. The nonvolatile semiconductor memory well voltage setting circuit as claimed in claim 2, further comprising:

a gate control circuit for controlling a gate of the N-MOS transistor of the second voltage supply circuit, wherein the gate control circuit is set so that the gate of the N-MOS transistor of the second voltage supply circuit needs a time of not shorter than 100 nanoseconds at a rise of the voltage thereof.

4. The nonvolatile semiconductor memory well voltage setting circuit as claimed in claim 1, wherein the second voltage supply circuit has a current supply capacity smaller than that of the third voltage supply circuit.

5. A nonvolatile semiconductor memory device comprising therein the well voltage setting circuit claimed in claim 1.

6. A well voltage setting circuit of a nonvolatile semiconductor memory, comprising:

floating-gate field-effect transistors able to electrically write and erase information, the floating-gate field-effect transistors being each provided with a control gate, a floating gate, a drain and a source, and arranged in rows and columns into a block to form a memory cell array;

a plurality of row lines each connected to control gates of the floating-gate field-effect transistors in each row;

a plurality of column lines each connected to drains of the floating-gate field-effect transistors in each column;

a source line connected commonly to sources of the floating-gate field-effect transistors in the block;

a first voltage supply circuit for applying a first voltage to a well which constitutes each of channel regions in arrangement of the memory cell array to be erased when an erase pulse is applied to the memory cell array in an erase operation wherein information of the memory cell array is erased on a block basis by channel erase using a Fowler-Nordheim tunneling phenomenon, wherein the first voltage supply circuit is constituted of a P-MOS transistor;

a second voltage supply circuit for applying a reference voltage to the well when the erase pulse application ends and during write and during read, wherein the second voltage supply circuit is constituted of an N-MOS transistor; and a control circuit for controlling the second voltage supply circuit, the control circuit being constituted of a level shifter to apply a voltage lower than a power voltage to a gate of the N-MOS transistor in turning on the N-MOS transistor of the second voltage supply circuit when the erase pulse application ends and to apply a voltage higher than the power voltage to the gate of the N-MOS transistor in turning on the N-MOS transistor of the second voltage supply circuit during write and during read.

7. A nonvolatile semiconductor memory device comprising therein the well voltage setting circuit claimed in claim 6.

8. A well voltage setting circuit of a nonvolatile semiconductor memory, comprising:

floating-gate field-effect transistors able to electrically write and erase information, the floating-gate field-effect transistors being each provided with a control gate, a floating gate, a drain and a source, and arranged in rows and columns into a block to form a memory cell array;

a plurality of row lines each connected to control gates of the floating-gate field-effect transistors in each row;

a plurality of column lines each connected to drains of the floating-gate field-effect transistors in each column;

a source line connected commonly to sources of the floating-gate field-effect transistors in the block;

a first voltage supply circuit for applying a first voltage to a well which constitutes each of channel regions in arrangement of the memory cell array to be erased when an erase pulse is applied to the memory cell array in an erase operation wherein information of the memory cell array is erased on a block basis by channel erase using a Fowler-Nordheim tunneling phenomenon;

a second voltage supply circuit for applying a reference voltage to the well after the erase pulse application and during write and during read; and a fourth voltage supply circuit whose capacity for supplying the reference voltage to an input power line of the second voltage supply circuit is made smaller than the capacity thereof during write and during read in a shutdown sequence after the erase pulse application.

9. The nonvolatile semiconductor memory well voltage setting circuit as claimed in claim 8, wherein the fourth voltage supply circuit is constituted of a resistor equivalent element and a first N-MOS transistor to supply a voltage for applying the reference voltage to the well through only the resistor equivalent element to the input power line of the second voltage supply circuit after the erase pulse application by the first voltage supply circuit, and to supply a voltage for applying the reference voltage to the well to the input power line of the second voltage supply circuit through the first N-MOS transistor and the resistor equivalent element by turning on the first N-MOS transistor during read and during write.

10. The nonvolatile semiconductor memory well voltage setting circuit as claimed in claim 8, wherein the fourth voltage supply circuit is constituted of a first N-MOS transistor and a second N-MOS transistor to supply a voltage for applying the reference voltage to the well through the second N-MOS transistor whose gate voltage is the power voltage to the input power line of the second voltage supply circuit after the erase pulse application by the first voltage supply circuit, and to supply a voltage for applying the reference voltage to the well to the input power line of the second voltage supply circuit by concurrently turning on the first N-MOS transistor during read and during write.

11. A nonvolatile semiconductor memory device comprising therein the well voltage setting circuit claimed in claim 8.

12. A well voltage setting circuit of a nonvolatile semiconductor memory, comprising:

floating-gate field-effect transistors able to electrically write and erase information, the floating-gate field-effect transistors being each provided with a control gate, a floating gate, a drain and a source, and arranged in rows and columns into a block to form a memory cell array;

a plurality of row lines each connected to control gates of the floating-gate field-effect transistors in each row;

a plurality of column lines each connected to drains of the floating-gate field-effect transistors in each column;

a source line connected commonly to sources of the floating-gate field-effect transistors in the block;

a first voltage supply circuit for applying a first voltage to a well which constitutes each of channel regions in arrangement of the memory cell array to be erased when an erase pulse is applied to the memory cell array in an erase operation wherein information of the memory cell array is erased on a block basis by channel erase using a Fowler-Nordheim tunneling phenomenon;

a second voltage supply circuit for applying a reference voltage to the well after the erase pulse application and during write and during read;

an intermediate voltage supply circuit for supplying an intermediate voltage for making the potential of the well once have an intermediate level between a potential when the erase pulse is applied and the reference voltage to an input power line of the second voltage supply circuit after the erase pulse application by the first voltage supply circuit; and a reference voltage supply circuit for making the potential of the well have the intermediate level by the intermediate voltage supply circuit and thereafter applying the reference voltage to the input power line of the second voltage supply circuit in a shutdown sequence after the erase pulse application.

13. A nonvolatile semiconductor memory device comprising therein the well voltage setting circuit claimed in claim 12.

* * * * *